(12) United States Patent
Sadaka et al.

(10) Patent No.: US 9,481,566 B2
(45) Date of Patent: Nov. 1, 2016

(54) METHODS OF FORMING SEMICONDUCTOR STRUCTURES INCLUDING MEMS DEVICES AND INTEGRATED CIRCUITS ON OPPOSING SIDES OF SUBSTRATES, AND RELATED STRUCTURES AND DEVICES

(71) Applicant: Soitec, Crolles (FR)

(72) Inventors: Mariam Sadaka, Austin, TX (US); Bernard Aspar, Saint-Ismier (FR); Chrystelle Lagahe Blanchard, Crolles (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/416,825

(22) PCT Filed: Jul. 8, 2013

(86) PCT No.: PCT/IB2013/001487
§ 371 (c)(1),
(2) Date: Jan. 23, 2015

(87) PCT Pub. No.: WO2014/020387
PCT Pub. Date: Feb. 6, 2014

(65) Prior Publication Data
US 2015/0191344 A1 Jul. 9, 2015

Related U.S. Application Data

(60) Provisional application No. 61/677,796, filed on Jul. 31, 2012.

(51) Int. Cl.
*H01L 29/40* (2006.01)
*B81B 7/00* (2006.01)
(Continued)

(52) U.S. Cl.
CPC ........... *B81B 7/007* (2013.01); *B81C 1/00238* (2013.01); *B81C 1/00246* (2013.01);
(Continued)

(58) Field of Classification Search
CPC .................................................. B81C 1/00246
See application file for complete search history.

(56) References Cited

U.S. PATENT DOCUMENTS

| 6,020,252 A | 2/2000 | Aspar et al. |
| 6,103,597 A | 8/2000 | Aspar et al. |

(Continued)

FOREIGN PATENT DOCUMENTS

| CN | 101837944 A | 9/2010 |
| EP | 2060533 A2 | 5/2009 |
| WO | 02096166 A1 | 11/2002 |

OTHER PUBLICATIONS

Chinese Office Action and Search Report in Chinese Application No. 201380040648.5, dated Oct. 23, 2015, 10 pages.
(Continued)

*Primary Examiner* — Cuong Q Nguyen
*Assistant Examiner* — Nishath Yasmeen
(74) *Attorney, Agent, or Firm* — TraskBritt

(57) ABSTRACT

Methods of forming semiconductor devices comprising integrated circuits and microelectromechanical system (MEMS) devices operatively coupled with the integrated circuits involve the formation of an electrically conductive via extending at least partially through a substrate from a first major surface of the substrate toward an opposing second major surface of the substrate, and the fabrication of at least a portion of an integrated circuit on the first major surface of the substrate. A MEMS device is provided on the second major surface of the substrate, and the MEMS device is operatively coupled with the integrated circuit using the at least one electrically conductive via. Structures and devices are fabricated using such methods.

19 Claims, 14 Drawing Sheets

(51) Int. Cl.
*B81C 1/00* (2006.01)
*H03H 9/10* (2006.01)

(52) U.S. Cl.
CPC ............ *B81C1/00301* (2013.01); *H03H 9/10* (2013.01); *B81B 2201/0271* (2013.01); *B81B 2207/012* (2013.01); *B81B 2207/015* (2013.01); *B81C 2203/0735* (2013.01); *B81C 2203/0792* (2013.01)

(56) References Cited

U.S. PATENT DOCUMENTS

| | | | |
|---|---|---|---|
| 6,110,802 | A | 8/2000 | Aspar et al. |
| 6,133,674 | A * | 10/2000 | Fry ................. H03H 9/0528 310/341 |
| 6,190,998 | B1 | 2/2001 | Bruel et al. |
| 6,197,695 | B1 | 3/2001 | Joly et al. |
| 6,204,079 | B1 | 3/2001 | Aspar et al. |
| 6,303,468 | B1 | 10/2001 | Aspar et al. |
| 6,316,333 | B1 | 11/2001 | Bruel et al. |
| 6,335,258 | B1 | 1/2002 | Aspar et al. |
| 6,362,077 | B1 | 3/2002 | Aspar et al. |
| 6,429,094 | B1 | 8/2002 | Maleville et al. |
| 6,756,285 | B1 | 6/2004 | Moriceau et al |
| 6,756,286 | B1 | 6/2004 | Moriceau et al. |
| 6,808,967 | B1 | 10/2004 | Aspar et al. |
| 6,809,044 | B1 | 10/2004 | Aspar et al. |
| 6,821,376 | B1 | 11/2004 | Rayssac et al. |
| 6,872,319 | B2 * | 3/2005 | Tsai .................. G02B 26/0833 216/2 |
| 6,909,445 | B2 | 6/2005 | Baleras et al. |
| 6,913,971 | B2 | 7/2005 | Aspar et al. |
| 6,939,782 | B2 | 9/2005 | Aspar et al. |
| 6,946,365 | B2 | 9/2005 | Aspar et al. |
| 6,959,863 | B2 | 11/2005 | Figuet et al. |
| 6,974,759 | B2 | 12/2005 | Moriceau et al. |
| 7,029,548 | B2 | 4/2006 | Aspar et al. |
| 7,060,590 | B2 | 6/2006 | Bressot et al. |
| RE39,484 | E | 2/2007 | Bruel |
| 7,189,304 | B2 | 3/2007 | Martinez et al. |
| 7,205,211 | B2 | 4/2007 | Aspar et al. |
| 7,238,598 | B2 | 7/2007 | Lagahe et al. |
| 7,264,996 | B2 | 9/2007 | Moriceau et al. |
| 7,406,994 | B2 | 8/2008 | Martinez et al. |
| 7,494,897 | B2 | 2/2009 | Fournel et al. |
| 7,615,463 | B2 | 11/2009 | Aspar et al. |
| 7,709,305 | B2 | 5/2010 | Aspar et al. |
| 7,713,369 | B2 | 5/2010 | Aspar et al. |
| 7,737,000 | B2 | 6/2010 | Rommeveaux et al. |
| 7,807,482 | B2 | 10/2010 | Aspar et al. |
| 7,902,038 | B2 | 3/2011 | Aspar et al. |
| 7,927,980 | B2 | 4/2011 | Tauzin et al. |
| 8,058,158 | B2 | 11/2011 | Bourdelle et al. |
| 2001/0007789 | A1 | 7/2001 | Aspar et al. |
| 2002/0022337 | A1 | 2/2002 | Maleville et al. |
| 2003/0047289 | A1 | 3/2003 | Jaussaud et al. |
| 2003/0052945 | A1 | 3/2003 | Baleras et al. |
| 2003/0234075 | A1 | 12/2003 | Aspar et al. |
| 2004/0014299 | A1 | 1/2004 | Moriceau et al. |
| 2004/0082147 | A1 | 4/2004 | Aspar et al. |
| 2004/0092087 | A1 | 5/2004 | Aspar |
| 2004/0104272 | A1 | 6/2004 | Figuet et al. |
| 2004/0110320 | A1 | 6/2004 | Aspar et al. |
| 2004/0144487 | A1 | 7/2004 | Martinez et al. |
| 2004/0166649 | A1 | 8/2004 | Bressot et al. |
| 2004/0171232 | A1 | 9/2004 | Cayrefourcq et al. |
| 2004/0222500 | A1 | 11/2004 | Aspar et al. |
| 2004/0252931 | A1 | 12/2004 | Belleville et al. |
| 2005/0029224 | A1 | 2/2005 | Aspar et al. |
| 2005/0112847 | A1 | 5/2005 | Moriceau et al. |
| 2005/0124138 | A1 | 6/2005 | Aspar et al. |
| 2005/0178495 | A1 | 8/2005 | Aspar et al. |
| 2005/0221583 | A1 | 10/2005 | Aspar et al. |
| 2006/0019476 | A1 | 1/2006 | Lagahe et al. |
| 2006/0166461 | A1 | 7/2006 | Fournel et al. |
| 2006/0281212 | A1 | 12/2006 | Moriceau et al. |
| 2007/0054433 | A1 * | 3/2007 | DeNatale .............. B81C 1/0069 438/48 |
| 2007/0072393 | A1 | 3/2007 | Aspar et al. |
| 2007/0200144 | A1 | 8/2007 | Aspar et al. |
| 2007/0281381 | A1 | 12/2007 | Ayazi |
| 2008/0036039 | A1 | 2/2008 | Aspar |
| 2008/0128868 | A1 | 6/2008 | Aspar |
| 2008/0176382 | A1 | 7/2008 | Aspar et al. |
| 2008/0254596 | A1 | 10/2008 | Aspar et al. |
| 2009/0149005 | A1 | 6/2009 | Tauzin et al. |
| 2009/0275152 | A1 | 11/2009 | Rommeveaux et al. |
| 2009/0280595 | A1 | 11/2009 | Broekaart et al. |
| 2009/0301995 | A1 | 12/2009 | Aspar et al. |
| 2010/0019393 | A1 | 1/2010 | Hsieh et al. |
| 2010/0053922 | A1 | 3/2010 | Ebefors et al. |
| 2010/0176397 | A1 | 7/2010 | Aspar et al. |
| 2010/0285213 | A1 | 11/2010 | Lagahe et al. |
| 2010/0289113 | A1 | 11/2010 | Bourdelle et al. |
| 2010/0301703 | A1 | 12/2010 | Chen et al. |
| 2010/0315179 | A1 | 12/2010 | Schoepf et al. |
| 2011/0024868 | A1 | 2/2011 | Drouin et al. |
| 2011/0147859 | A1 | 6/2011 | Tanaka et al. |
| 2011/0187227 | A1 | 8/2011 | Chen et al. |
| 2011/0250416 | A1 | 10/2011 | Bruel et al. |
| 2011/0273061 | A1 | 11/2011 | Thalmayr et al. |
| 2011/0284995 | A1 | 11/2011 | Kuypers et al. |
| 2012/0013012 | A1 | 1/2012 | Sadaka et al. |
| 2012/0013013 | A1 | 1/2012 | Sadaka et al. |

OTHER PUBLICATIONS

International Search Report for International Application No. PCT/IB2013/001487 dated Oct. 30, 2013, 4 pages.
International Written Opinion for International Application No. PCT/IB2013/001487 dated Oct. 30, 2013, 5 pages.

* cited by examiner

METHODS OF FORMING SEMICONDUCTOR STRUCTURES INCLUDING MEMS DEVICES AND INTEGRATED CIRCUITS ON OPPOSING SIDES OF SUBSTRATES, AND RELATED STRUCTURES AND DEVICES

CROSS-REFERENCE TO RELATED APPLICATIONS

This application is a national phase entry under 35 U.S.C. §371 of International Patent Application PCT/IB2013/001487, filed Jul. 8, 2013, designating the United States of America and published in English as International Patent Publication WO 2014/020387 A1 on Feb. 6, 2014, which claims the benefit under Article 8 of the Patent Cooperation Treaty and under 35 U.S.C. §119(e) to U.S. Provisional Patent Application Ser. No. 61/677,796, filed Jul. 31, 2012, the disclosure of each of which is hereby incorporated herein in its entirety by this reference.

TECHNICAL FIELD

The present disclosure relates to methods of manufacturing semiconductor structures that include one or more microelectromechanical system (MEMS) devices and conductive vias therein, and to semiconductor structures fabricated using such methods.

BACKGROUND

Semiconductor structures are structures that are used or formed in the fabrication of semiconductor devices. Semiconductor devices include, for example, electronic signal processors, electronic memory devices, photoactive devices, and microelectromechanical system (MEMS) devices. Such structures and materials often include one or more semiconductor materials (e.g., silicon, germanium, a III-V semiconductor material, etc.), and may include at least a portion of an integrated circuit.

MEMS devices are small devices that have both physically active features and electrically active features. The active features of MEMS devices may have micro-scale and/or nano-scale features. For example, MEMS devices may have active features having cross-sectional dimensions of about 100 µm or less.

MEMS devices often comprise a transducer that converts electrical energy in the form of, for example, a voltage or current into kinetic energy (physical energy) in the form of, for example, mechanical deflection or vibrations, or to convert kinetic energy into electrical energy. For example, MEMS devices include resonators that generate resonant mechanical vibrations responsive to an applied electrical signal. MEMS devices also include sensors that are used to sense physical phenomena (e.g., deflection, pressure, vibrations, etc.), by sensing variations in an electrical signal caused by the physical phenomena. Some MEMS devices may be characterized as both resonators and sensors.

Many types of MEMS resonators are known in the art and include, for example, plate acoustic wave resonators, flexural mode resonators, bulk acoustic wave (BAW) resonators, surface acoustic wave (SAW) resonators, and film bulk acoustic resonators (FBARs).

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes methods of forming semiconductor devices comprising integrated circuits and MEMS devices operatively coupled with the integrated circuits. In accordance with such methods, an electrically conductive via may be formed that extends at least partially through a substrate from a first major surface of the substrate toward an opposing second major surface of the substrate. At least a portion of an integrated circuit is fabricated on the first major surface of the substrate. A MEMS device is provided on the second major surface of the substrate, and the MEMS device is operatively coupled with the integrated circuit using the at least one electrically conductive via.

In additional embodiments, the present disclosure includes semiconductor structures having at least a portion of an integrated circuit formed on a first major surface of a substrate, a MEMS device comprising a transducer on a second major surface of the substrate, and a conductive via extending through the substrate and electrically coupling the MEMS device to the at least a portion of the integrated circuit. The second major surface of the substrate is disposed on an opposing side of the substrate from the first major surface of the substrate.

In yet further embodiments, the present disclosure includes electronic devices that comprise a substrate having an active surface and an opposing back surface, active components of an integrated circuit on the active surface of the substrate, a MEMS transducer on the back surface of the substrate, and a conductive via extending through the substrate and electrically coupling the MEMS transducer to an active component of the integrated circuit on the active surface of the substrate.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

FIG. 1 is a simplified cross-sectional view illustrating a substrate;

FIG. 2 illustrates electrically conductive vias extending partially through the substrate of FIG. 1 from a first major surface of the substrate toward a second major surface of the substrate;

FIG. 3 illustrates transistors formed at the first major surface of the substrate;

FIG. 4 illustrates conductive features fabricated over the transistors of FIG. 3 and communicating electrically with the transistors and the electrically conductive vias;

FIG. 5 illustrates a recess formed in the second major surface of the substrate;

FIG. 6 illustrates a MEMS device disposed at least partially in the recess in the substrate shown in FIG. 5 and coupled with the electrically conductive vias;

FIG. 7 illustrates electrically conductive contacts formed over the first major surface of the substrate;

FIG. 8 illustrates the structure of FIG. 7 structurally and electrically coupled to a higher level substrate using the electrically conductive contacts formed over the first major surface of the substrate;

FIG. 9 illustrates a structure like that of FIG. 4, which includes a substrate, electrically conductive vias extending partially through the substrate from a first major surface of the substrate toward a second major surface of the substrate, and transistors and other electrically conductive features over the first major surface of the substrate;

FIG. 10 illustrates a structure faulted by thinning the substrate of FIG. 9 by removing material from the second major surface of the substrate;

FIG. 11 illustrates a transducer cavity recess formed in the second major surface of the substrate of FIG. 10;

FIG. 12 illustrates a semiconductor-on-insulator-type structure bonded to the second major surface of the substrate of FIG. 11;

FIG. 13 illustrates a relatively thin layer of material transferred from the semiconductor-on-insulator-type structure to the second major surface of the substrate;

FIG. 14 illustrates a structure formed by processing the transferred thin layer of material as shown in FIG. 13 to form a resonator comprising a portion of the thin layer of material;

FIG. 15 illustrates electrical contact structures formed through the transferred thin layer of material of FIG. 14 to establish electrical contact between one or more of the electrically conductive vias and the resonator comprising a portion of the thin layer of material;

FIG. 16 illustrates a cap structure bonded over the second major surface of the substrate, the thin layer of material, and the resonator comprising a portion of the thin layer of material;

FIG. 17 illustrates electrically conductive contacts formed over the first major surface of the substrate;

FIG. 18 illustrates the structure of FIG. 17 structurally and electrically coupled to a higher level substrate using the electrically conductive contacts formed over the first major surface of the substrate;

FIG. 19 illustrates a structure similar to that of FIG. 10, which includes a substrate, electrically conductive vias extending partially through the substrate from a first major surface of the substrate to a second major surface of the substrate, and transistors and other electrically conductive features over the first major surface of the substrate;

FIG. 20 illustrates a transducer cavity recess formed in the second major surface of the substrate of FIG. 19;

FIG. 21 illustrates a semiconductor-on-insulator-type structure;

FIG. 22 illustrates a transducer cavity recess formed in a major surface of a substrate;

FIG. 23 illustrates the semiconductor-on-insulator-type structure of FIG. 21 bonded to the major surface of the substrate of FIG. 22;

FIG. 24 illustrates a relatively thin layer of material transferred from the semiconductor-on-insulator-type structure of FIG. 21 to the second major surface of the substrate of FIG. 22 by removing a relatively thick volume of bulk material from the semiconductor-on-insulator-type structure after forming the bonded structure of FIG. 23;

FIG. 25 illustrates a structure formed by processing the transferred thin layer of material as shown in FIG. 24 to form a resonator comprising a portion of the thin layer of material;

FIG. 26 illustrates the structure of FIG. 25 structurally and electrically coupled with the structure of FIG. 20, such that the resonator of the structure of FIG. 25 is electrically coupled with the electrically conductive vias of the structure of FIG. 20;

FIG. 27 illustrates electrically conductive contacts formed on the structure of FIG. 26; and FIG. 28 illustrates the structure of FIG. 27 structurally and electrically coupled to a higher level substrate using the electrically conductive contacts.

DETAILED DESCRIPTION

The illustrations presented herein are not meant to be actual views of any particular semiconductor material, structure, or device, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

The present disclosure includes methods that may be used to form semiconductor devices that include at least a portion of an integrated circuit and a MEMS device. The integrated circuit includes electrically conductive vias, one or more of which may communicate electrically with the MEMS device. The MEMS device may be fabricated separately from a substrate on which the integrated circuit device is fabricated and subsequently bonded to the substrate, the MEMS device may be integrally formed on the same substrate on which the integrated circuit is fabricated, or a portion of the MEMS device may be integrally formed on the same substrate on which the integrated circuit is fabricated and another portion of the MEMS device may be formed separately from the substrate and subsequently bonded to the substrate. Examples of such methods are disclosed in further detail below.

FIGS. 1 through 8 illustrate a non-limiting example of a method of forming a semiconductor device that includes the formation of at least a portion of an integrated circuit on a substrate, and subsequently attaching a separately formed MEMS device to a back side of the substrate.

Figure 1:
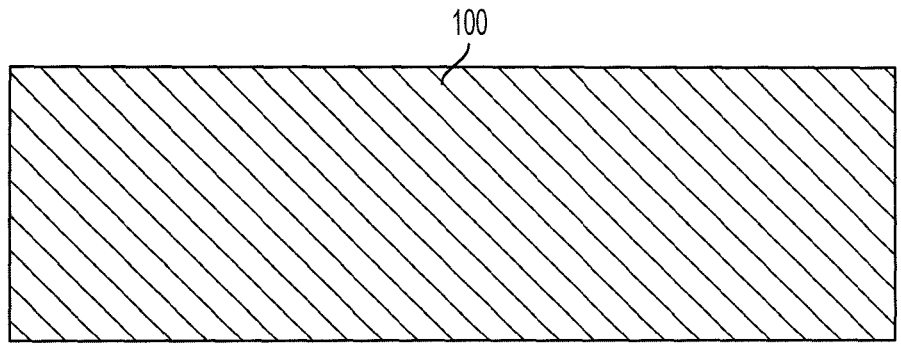
FIGS. 1 through 8 illustrate an example of a method that may be used to form a semiconductor device comprising at least a portion of an integrated circuit and a MEMS device operatively coupled with the integrated circuit, wherein the MEMS device is fabricated separately from the substrate on which the integrated circuit is formed and subsequently bonded thereto.

FIG. 1 is a simplified cross-sectional view of a substrate 100. The substrate 100 may comprise what is referred to in the art as a "die" or a "wafer," and may be generally planar. The substrate 100 may comprise any of a number of materials conventionally used for substrates in the fabrication of integrated circuits. As non-limiting examples, the substrate 100 may comprise an oxide (e.g., aluminum oxide, zirconium oxide, silicon oxide, etc.) or a semiconductor material (e.g., silicon, germanium, a III-V semiconductor material, etc.). In some embodiments, the substrate 100 may comprise a crystalline material (e.g., polycrystalline or monocrystalline material). Further, the substrate 100 may be at least substantially comprised by a single, generally homogeneous material, or the substrate 100 may comprise a multi-layer structure.

Figure 2:
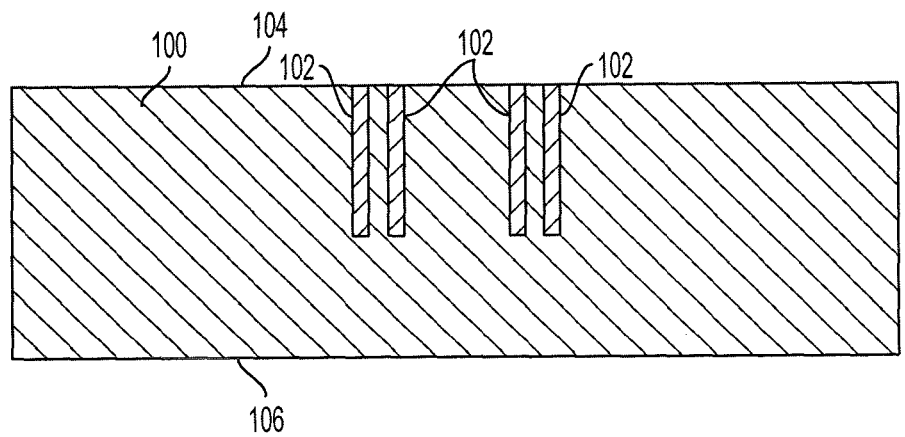

Referring to FIG. 2, one or more electrically conductive vias 102 may be formed in the substrate 100. The one or more electrically conductive vias 102 may be formed in the substrate 100 from a first major surface 104 of the substrate 100 toward a second major surface 106 of the substrate 100 on an opposing side of the substrate 100. FIG. 2 illustrates four (4) conductive vias 102, although the substrate 100 may in fact include any number of conductive vias 102. The conductive vias 102 may be formed using processes known in the art. For example, via holes may be formed into the substrate 100 using, for example, a photolithographic masking and etching process. In such embodiments, a mask layer may be deposited over the first major surface 104 of the substrate 100 and selectively patterned so as to form apertures through the mask layer at the locations at which it is desired to etch into the substrate 100 to form the via holes. After forming the patterned mask layer, the regions of the substrate 100 that are exposed through the patterned mask layer may be etched using, for example, a dry reactive ion etching process to form the via holes in the substrate 100. After the etching process, the patterned mask layer may be removed, and the via holes may be filled with electrically conductive material to form the conductive vias 102. The electrically conductive material may comprise, for example, doped polysilicon. In some embodiments, the conductive material may comprise a multi-layer structure including multiple layers of different conductive materials. The conductive material may be deposited within the via holes using one or more of a deposition process (e.g., a physical vapor deposition process (PVD) or a chemical vapor deposition (CVD) process), an electroless plating process, and an electrolytic plating process.

As shown in FIG. 2, the conductive vias 102 may extend only partially through the substrate 100 in some embodiments. In other embodiments, the conductive vias 102 may extend entirely through the substrate 100. In some embodiments, the substrate 100 may have an average layer thickness between the first major surface 104 and the second major surface 106 (the vertical dimension from the perspective of FIG. 2) of about two hundred and fifty microns (250 µm) or more, about five hundred microns (500 µm) or more, or even about seven hundred and fifty microns (750 µm) or more. The conductive vias 102, however, may have an average cross-sectional dimension (e.g., average diameter) such that an aspect ratio (the aspect ratio being the ratio of length to average cross-sectional dimension) of the conductive vias 102 is about twenty-five (25) or less, about ten (10) or less, or even about five (5) or less. It may be difficult to fabricate conductive vias 102 that have a high aspect ratio. Thus, it may be desirable to form the conductive vias 102 partially through the substrate 100, and then to subsequently thin at least a portion of the substrate 100 so as to expose the conductive vias 102 at the second major surface 106 of the substrate as discussed below.

Figure 3:
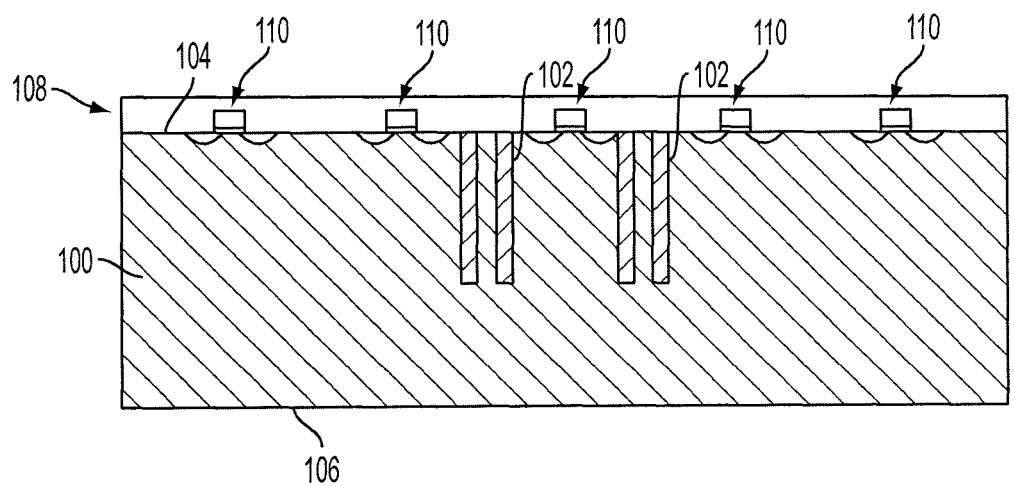

At least a portion of an integrated circuit may be fabricated on the first major surface 104 of the substrate 100. For example, FIG. 3 illustrates an active layer 108 formed on the first major surface 104 that includes a plurality of transistors 110. Thus, the first major surface 104 of the substrate 100 may comprise what is often referred to in the art as an "active surface" of the substrate 100, and the second major surface 106 of the substrate 100 may comprise what is often referred to in the art as a "back surface" of the substrate 100. The transistors 110 may be formed in, on, and/or over the first major surface 104 of the substrate 100 using processes known in the art. As a non-limiting example, the transistors 110 may comprise metal oxide semiconductor field effect transistors (MOSFETs), and may embody complementary metal oxide semiconductor (CMOS) technology. The processes often employed in the art to fabricate such transistors 110 are often referred to in the art as "front-end-of-line" (FEOL) processes, and often involve processes carried out at temperatures greater than four hundred degrees Celsius (400° C.). Thus, in such embodiments, the conductive material used to form the conductive vias 102, which are fabricated prior to forming the active layer 108, may comprise a material that is stable through the temperature ranges to which the structure will be subjected during the FEOL processes used to form the transistors 110. For example, the conductive material used to form the conductive vias 102 may comprise doped polysilicon in such embodiments.

Figure 4:
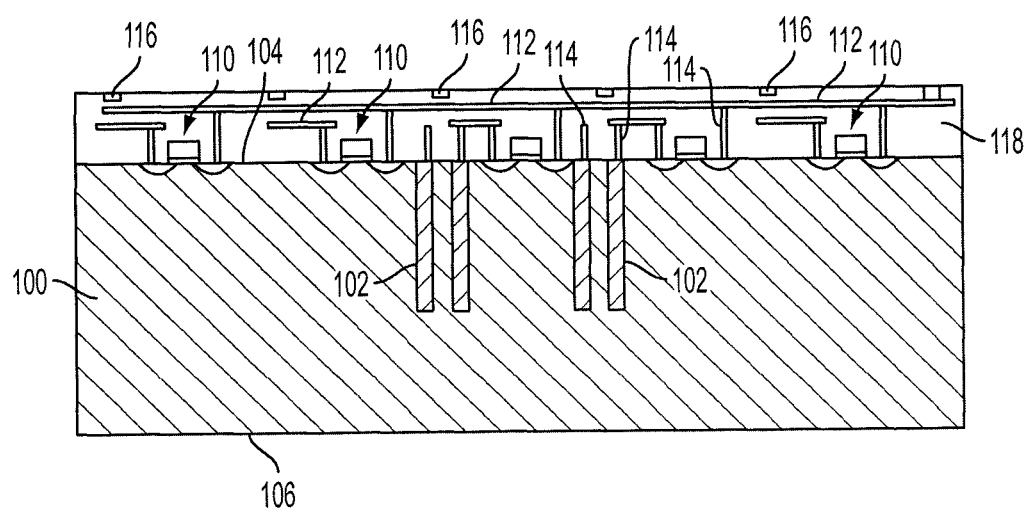

Referring to FIG. 4, after forming the transistors 110, one or more additional layers of electrically conductive features used to electrically interconnect various features of the transistors 110 (e.g., sources, drains, and gates of the transistors 110) may be formed over the transistors 110 on a side thereof opposite the first major surface 104 of the substrate 100. The conductive features may comprise one or more of laterally extending conductive lines 112 (e.g., traces), vertically extending conductive vias 114, and electrical contact pads 116. The conductive features may comprise electrically conductive material regions (e.g., copper, aluminum, tungsten, etc.) that are at least partially embedded in a dielectric material 118. The one or more layers of conductive features and surrounding dielectric material 118 may be formed in a layer-by-layer lithographic process over the transistors 110. In such processes, layers of dielectric material and layers of conductive material may be deposited and selectively patterned in an alternating manner to form the various conductive features and the dielectric material 118. The processes often employed in the art to fabricate these electrically conductive features are often referred to in the art as "back-end-of-line" (BEOL) processes, and often involve processes carried out at temperatures of about four hundred degrees Celsius (400° C.) or less (although, in some embodiments, one or more initial layers of metal deposited as part of the BEOL processes may comprise tungsten, which may be deposited at temperatures up to about nine hundred degrees Celsius (900° C.)).

One or more of the conductive features formed over the transistors 110 (e.g., one or more of the conductive lines 112, conductive vias 114, and electrical contact pads 116) may be electrically coupled with one or more of the conductive vias 102. Stated another way, a continuous electrical pathway may be provided between at least one conductive via 102 and one or more of the conductive features.

In additional embodiments, the conductive vias 102 may be fabricated after formation of the transistors 110 instead of prior to formation of the transistors 110. In other words, the transistors 110 may be fabricated on the substrate 100, and the conductive vias 102 then may be fabricated through the active layers comprising the transistors 110 and partially through the substrate 100. Thus, the conductive vias 102 may be fabricated prior to standard FEOL processes, after standard FEOL processes and prior to standard BEOL processes, or after BEOL processes. As previously mentioned, one or more initial layers of metal deposited as part of the BEOL processes may comprise tungsten, which may be deposited at temperatures up to about nine hundred degrees Celsius (900° C.)). In some embodiments, the conductive vias 102 may be fabricated after depositing such initial layers of tungsten in BEOL processing, but prior to completing the BEOL processing.

In embodiments in which the conductive vias 102 are fabricated after the FEOL processes, the conductive vias 102 may comprise conductive materials that are not necessarily stable at temperatures higher than 900° C., or even higher than 400° C., as subsequent processing may be limited to lower temperatures due to the presence of the BEOL features. Thus, the conductive vias 102 may comprise a metal, a metal alloy, or doped polysilicon in such embodiments.

After the FEOL processing and BEOL processing as described above, a MEMS device may be provided at (e.g., on or over) the second major surface 106 of the substrate 100 and operatively coupled with the integrated circuit (which may include the transistors 110, the conductive lines 112, conductive vias 114, and contact pads 116) using one or more of the electrically conductive vias 102.

For example, a recess may be formed in the second major surface 106 of the substrate 100, and a separately fabricated MEMS device may be at least partially disposed within the recess and structurally and electrically coupled with the conductive vias 102, as discussed below with reference to FIGS. 5 and 6.

Figure 5:
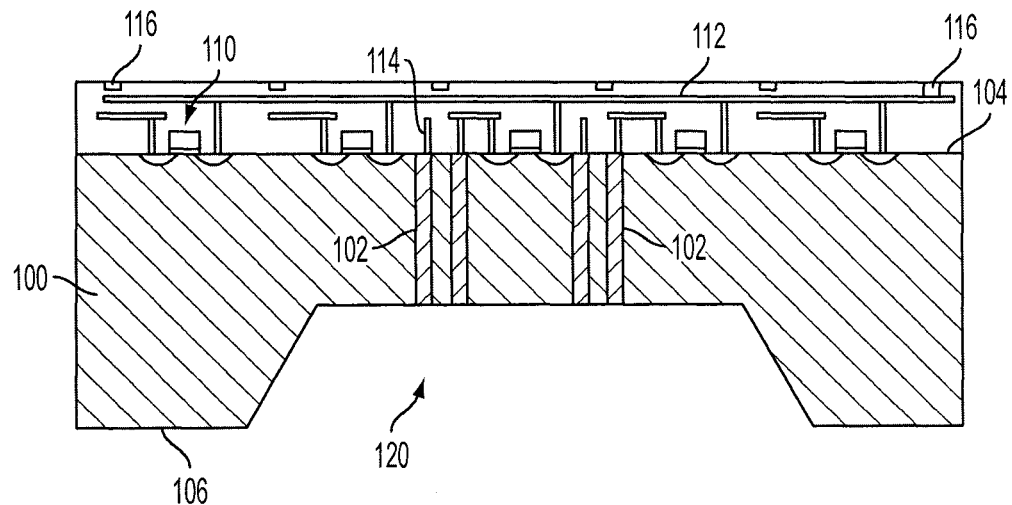

Referring to FIG. 5, a recess 120 may be formed in the second major surface 106 of the substrate 100. The recess 120 may be formed in the second major surface 106 of the substrate 100 using, for example, a photolithographic masking and etching process. In such embodiments, a mask layer may be deposited over the second major surface 106 of the substrate 100 and selectively patterned so as to form an aperture through the mask layer at the location at which it is desired to etch into the substrate 100 to form the recess 120. After forming the patterned mask layer, the region of the substrate 100 that is exposed through the aperture of the patterned mask layer may be etched using, for example, a wet chemical etching process or a dry reactive ion etching process to form the recess 120 in the second major surface 106 of the substrate 100. After the etching process, the patterned mask layer may be removed.

As one non-limiting example, in embodiments in which the substrate 100 comprises silicon, the recess 120 may be etched in the silicon substrate 100 using a wet chemical etching process in which a solution comprising between about 20% and about 50% by volume potassium hydroxide (KOH), and between about 50% and about 80% by volume water ($H_2O$). The etching process may be carried out at a temperature of between about twenty degrees Celsius (20° C.) and about one hundred degrees Celsius (100° C.) for a sufficient time to form a recess 120 having desirable dimensions.

As a non-limiting example, the recess 120 may have an average depth into the substrate 100 (the vertical dimension from the perspective of FIG. 5) of at least about one hundred microns (100 μm), at least about three hundred microns (300 μm), or even at least about five hundred microns (500 μm). Additionally, the recess 120 may have an average width parallel to the second major surface 106 of the substrate 100 (the horizontal dimension from the perspective of FIG. 5) of at least about one tenth of a centimeter (0.1 cm), at least about one-half of a centimeter (0.5 cm), or even at least about one centimeter (1.0 cm). The cross-sectional shape of the recess 120 may depend on whether the etchant employed in the etching process is an isotropic etchant or an anisotropic etchant.

As shown in FIG. 5, the etching process may be conducted such that the recess 120 extends a sufficient depth into the second major surface 106 of the substrate 100 to expose ends of the conductive vias 102 at the second major surface 106 of the substrate 100 within the recess 120. Thus, the conductive vias 102 may extend entirely through the substrate 100 from the first major surface 104 to the second major surface 106 of the substrate 100, at least subsequent to the etching process used to form the recess 120. Thus, the conductive vias 102 may comprise what are often referred to in the art as "through-wafer vias" (TWVs) or, in embodiments in which the substrate 100 comprises silicon, "through-silicon vias" (TSVs).

Figure 6:
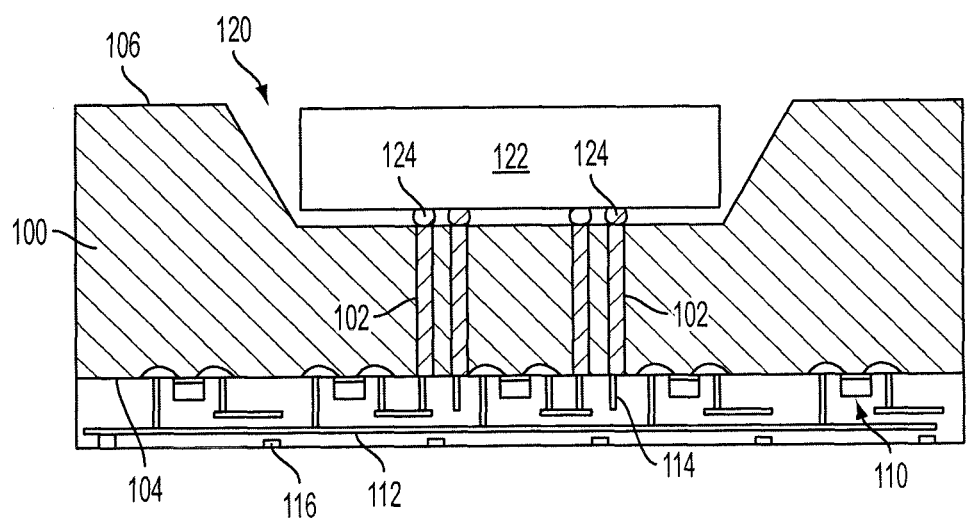

Referring to FIG. 6, after forming the recess 120 in the second major surface 106 of the substrate 100, a separately fabricated MEMS device 122 may be disposed at least partially within the recess 120, bonded to the substrate 100, and operatively coupled with the integrated circuit carried on the substrate 100.

In some embodiments, the MEMS device 122 comprises a transducer, such as a resonator and/or a sensor. As non-limiting examples, the MEMS device 122 may comprise one or more of a plate acoustic wave resonator, a flexural mode resonator, a bulk acoustic wave (BAW) resonator, a surface acoustic wave (SAW) resonator, and a film bulk acoustic resonator (FBAR).

In some embodiments, ends of the electrically conductive vias 102 may be structurally and electrically coupled to corresponding electrically conductive features of the MEMS device 122 to bond the MEMS device 122 to the substrate 100. For example, the MEMS device 122 may comprise electrical contacts 124, one or more of which may be structurally and electrically coupled to the electrically conductive vias 102. Although not shown in FIG. 6, electrical contact pads optionally may be formed on the ends of the conductive vias 102 that are exposed at the second major surface 106 of the substrate 100 within the recess 120. The electrical contacts 124 of the MEMS device 122 then may be structurally and electrically coupled with the contact pads formed on the ends of the conductive vias 102. In other embodiments, the electrical contacts 124 may be structurally and electrically coupled directly to the exposed ends of the conductive vias 102. The electrical contacts 124 of the MEMS device 122 may comprise, for example, metal balls or bumps that may be structurally and electrically coupled to the conductive vias 102 or contact pads formed on the conductive vias 102 using a solder reflow process, a thermo-compression bonding process, a non-thermo-compression bonding process, or any other known process for establishing a structural and electrical interconnection between the conductive features of such devices. In other embodiments, the electrical contacts 124 may comprise flush contact pads that are at least substantially flush with the lower major surface of the MEMS device 122, and the flush contact pads may be bonded directly to the exposed ends of the conductive vias 102 in a direct metal-to-metal bonding process.

The bonding configuration illustrated in FIG. 6 is often referred to in the art as a "flip-chip" configuration.

In other embodiments, the MEMS device 122 may be structurally bonded to the substrate 100 using an adhesive such as a curable resin (e.g., epoxy), and conductive features of the MEMS device 122 then may be wire bonded to the conductive vias 102 or to contact pads formed on the conductive vias 102.

Although not shown in FIG. 6, epoxy or other resin material may be provided in any spaces between the MEMS device 122 and the substrate 100 and used as an "underfill" material. Similarly, epoxy or other resin material may be provided over and around the MEMS device 122 and used as an "encapsulant" material.

Although the MEMS device 122 is illustrated in FIG. 6 as having a back surface that is at least substantially flush with the second major surface 106 of the substrate 100, in other embodiments, the MEMS device 122 may protrude from the second major surface 106 of the substrate 100, or may be recessed relative to the second major surface 106 of the substrate 100.

Figure 7:
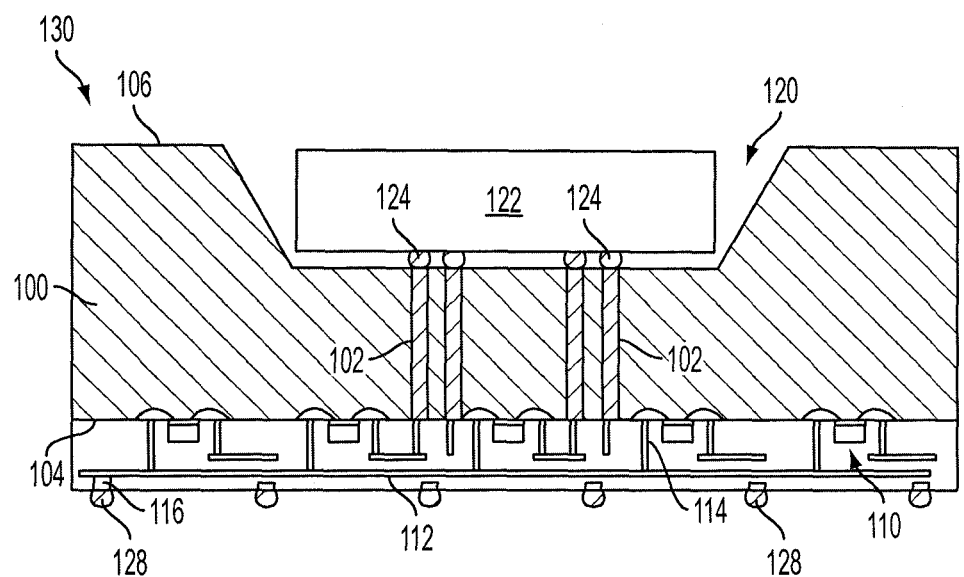

As shown in FIG. 7, bumps or balls 128 of electrically conductive metal or metal alloy optionally may be formed on the contact pads 116 over the first major surface 104 of the substrate 100. The bumps or balls 128 may be used to structurally and electrically couple the bonded semiconductor structure 130 of FIG. 7 to another structure or device. In some embodiments, the bumps or balls 128 may comprise a solder alloy, and may be structurally and electrically coupled to conductive features of another structure or device using a solder reflow process. In other embodiments, the bumps or balls 128 may comprise a metal or metal alloy having a relatively higher melting point than conventional solder alloys, and may be structurally and electrically coupled to conductive features of another structure or device using a thermo-compression bonding process.

Figure 8:
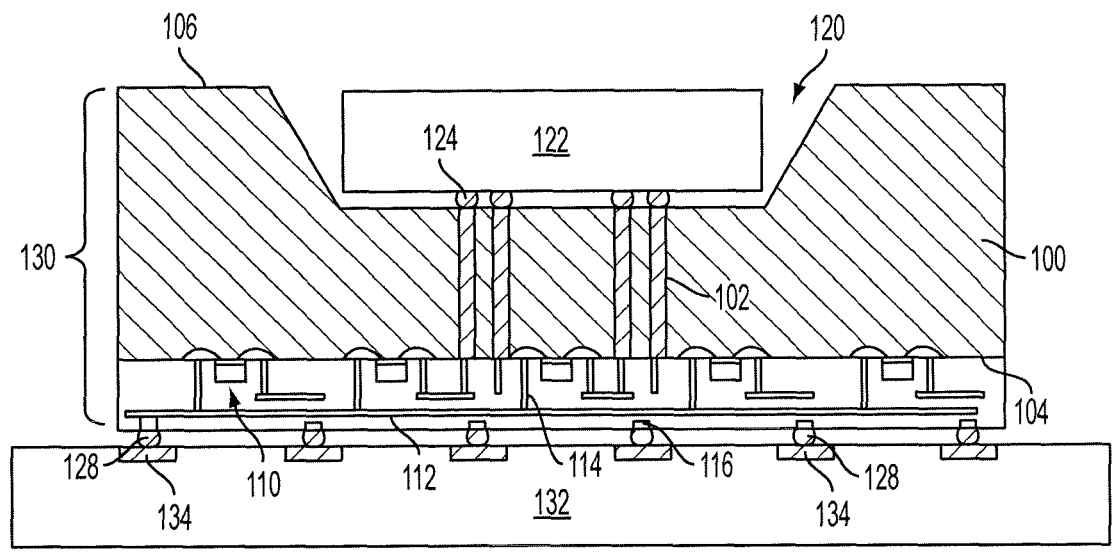

FIG. 8 illustrates the structure 130 of FIG. 7 structurally and electrically coupled to another structure or device 132, such that the substrate 100 is disposed between the MEMS device 122 and the structure or device 132. By way of example and not limitation, the bumps or balls 128 of electrically conductive material may be structurally and electrically bonded to complementary electrical contacts 134 (e.g., bond pads, etc.) on the another structure or device 132. The structure or device 132 may comprise, for example, a higher level substrate, such as a printed circuit board.

In the method described above with reference to FIGS. 1 through 8, the MEMS device is fabricated separately from the substrate 100 and the integrated circuit formed thereon. In additional embodiments, at least a portion of a MEMS device may be integrally formed on the second major surface 106 of the substrate 100. One example of such a method is discussed below with reference to FIGS. 9 through 18.

Figure 9:
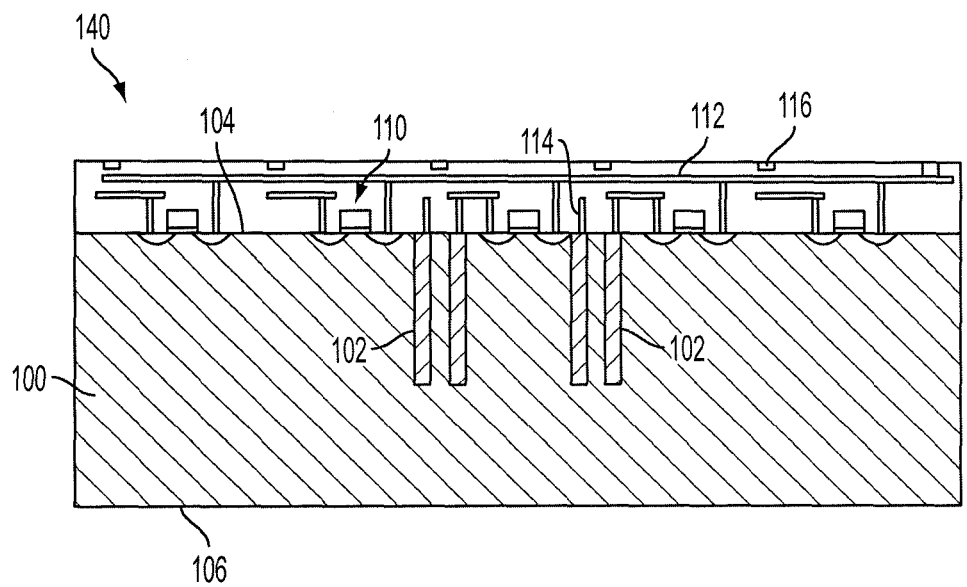
FIGS. 9 through 18 illustrate another example of a method that may be used to form a semiconductor device comprising at least a portion of an integrated circuit and a MEMS device operatively coupled with the integrated circuit, wherein at least a portion of the MEMS device is integrally fabricated with the substrate on which the integrated circuit is formed.

FIG. 9 illustrates a structure 140 identical to that shown in FIG. 4. The structure 140 includes a substrate 100 having a first major surface 104 and an opposing second major surface 106. Conductive vias 102 extend at least partially through the substrate 100 from the first major surface 104 toward the second major surface 106. The structure 140 also includes transistors 110, and electrically conductive features formed over the transistors 110, such as conductive lines 112, conductive vias 114, and electrical contact pads 116. The structure 140 may be formed as previously described with reference to FIGS. 1 through 4.

Figure 10:
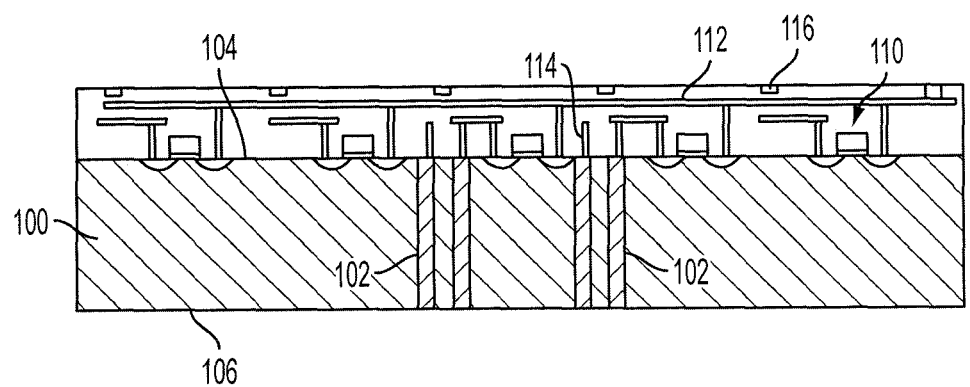

Referring to FIG. 10, the substrate 100 optionally may be thinned by removing material of the substrate 100 from the second major surface 106 of the substrate 100. By way of example and not limitation, one or more of an etching process, a grinding process, and a polishing process (e.g., a chemical-mechanical polishing (CMP) process) may be used to thin the substrate 100. In embodiments in which the conductive vias 102 do not extend entirely through the substrate 100 in the structure 140 of FIG. 9, the thinning process may be carried out at least until ends of the conductive vias 102 are exposed at the second major surface 106 of the substrate 100. In some embodiments, the substrate 100 may have an average thickness after the thinning process of, for example, about two hundred and fifty microns (250 μm) or less, about two hundred microns (200 μm) or less, or even about one hundred microns (100 μm) or less. Optionally, a carrier substrate may be temporarily bonded to the structure 140 over the first major surface 104 of the substrate 100 to facilitate handling of the structure 140 by processing equipment during the thinning process (and/or subsequent processing) as desired.

Figure 11:
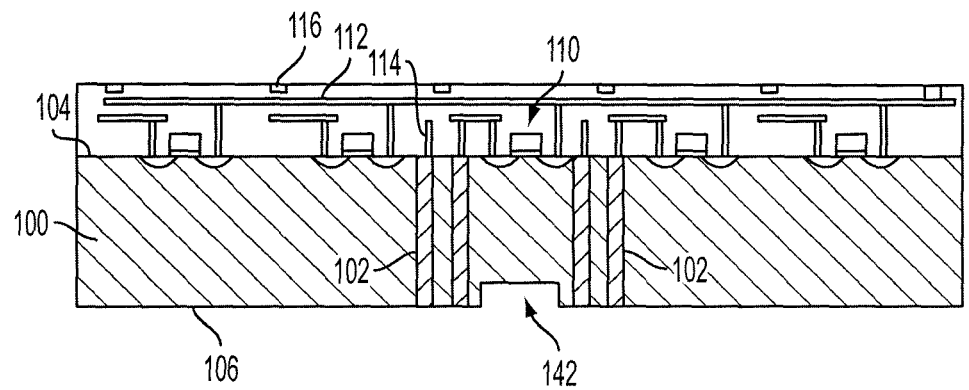

Referring to FIG. 11, at least one transducer cavity recess 142 may be formed in the second major surface 106 of the substrate 100. The transducer cavity recess 142 is ultimately used to form at least a portion of a transducer cavity in which at least a portion of a transducer of a MEMS device is to be disposed. The transducer cavity recess 142 may be formed in the second major surface 106 of the substrate 100 using, for example, a photolithographic masking and etching process like that previously described in relation to the recess 120 of FIG. 5. The transducer cavity recess 142 may have any desirable size and shape, and the desired size and shape may be at least partially a function of the type of transducer to be formed. As non-limiting examples, the transducer cavity recesses 142 may extend an average depth into the surface 106 of the substrate 100 (the vertical dimension from the perspective of FIG. 11) that is at least about one micron (1 μm), at least about ten microns (10 μm), at least about one hundred microns (100 μm), or even five hundred microns (500 μm) or more. Additionally, the transducer cavity recesses 142 may have an average width parallel to the second major surface 106 of the substrate 100 (the horizontal dimension from the perspective of FIG. 11) of at least about fifty microns (50 μm), at least about five hundred microns (500 μm), at least about one thousand microns (1,000 μm), or even greater. In embodiments in which the transducer to be formed comprises a resonator, the frequencies at which the resonator is to resonate may be at least partially a function of the size and shape of the transducer cavity recess 142, and the size and shape of the transducer cavity recess 142 may be designed and selected to provide desirable resonant frequencies.

Figure 12:
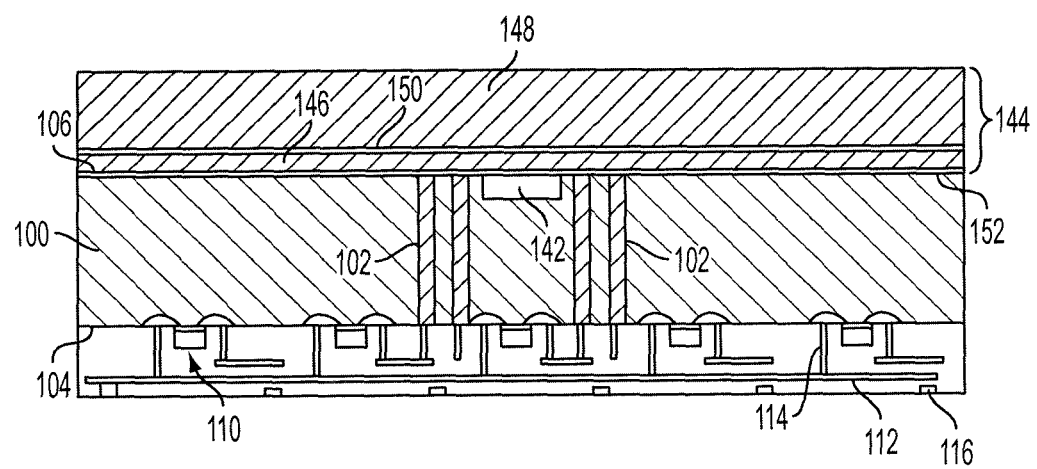

In some embodiments, the transducer cavity recess 142 may be located proximate one or more of the conductive vias 102. Optionally, the transducer cavity recess 142 may be located between at least two conductive vias 102, as shown in FIG. 12, such that a first conductive via is disposed on a first lateral side of the transducer cavity recess 142 and a second conductive via is disposed on an opposing lateral side of the transducer cavity recess 142.

After forming the transducer cavity recess 142, a transducer may be formed over the transducer cavity recess 142. Referring to FIG. 12, as a non-limiting example of a method that may be used to form such a transducer, a semiconductor-on-insulator-type (SOI-type) structure 144 may be bonded over the second major surface 106 of the substrate 100 and over the transducer cavity recess 142. The SOI-type structure 144 includes a relatively thin layer of material 146 bonded to a relatively thick volume of bulk material 148 with an intermediate material 150 between the layer of material 146 and the bulk material 148. The layer of material 146 is thin relative to the bulk material 148, and the bulk material 148 is thick relative to the layer of material 146.

The intermediate material 150 may be approximately equal in thickness to the layer of material 146, or it may be thinner than the layer of material 146.

The SOI-type structure 144 is a structure having a structural configuration like that of conventional semiconductor-on-insulator (SOI) structures, although the layer of material 146 may or may not comprise a semiconductor material, and the intermediate material 150 may or may not comprise an insulator material. A portion of the layer of material 146 is ultimately used to form at least a portion of a transducer (e.g., a resonator or a sensor), and may comprise, for example, a piezoelectric material, a semiconductor material, a ceramic material, or a metal material. Piezoelectric materials include, for example, quartz (crystalline $SiO_2$), $AlPO_4$, $GaPO_4$, $BaTiO_3$, lead zirconate titanate (PZT), zinc oxide, and aluminum nitride. The layer of material 146 may comprise any of these piezoelectric materials in some embodiments. In other embodiments, the layer of material 146 may comprise a semiconductor material such as silicon, germanium, or a III-V semiconductor material (e.g., GaN, AlN, InN, GaP, AlP, InP, etc.).

The bulk material 148 may comprise any of a number of materials conventionally used for SOI substrates. Such materials include, for example, ceramics such as oxides (e.g., aluminum oxide, zirconium oxide, silicon oxide, etc.), nitrides (e.g., silicon nitride), and carbides (e.g., silicon carbide), as well as semiconductor materials (e.g., silicon, germanium, a III-V semiconductor material, etc.). The bulk material 148 may comprise an amorphous material or a crystalline material (e.g., polycrystalline or monocrystalline material). The intermediate material 150 may comprise a dielectric material, a metal material, or a semiconductor material. As a non-limiting example, the intermediate material 150 may comprise an oxide such as silicon dioxide.

The layer of material 146 may have any desirable average layer thickness. As non-limiting examples, the layer of material 146 may have an average layer thickness between about five nanometers (5 nm) and about five hundred microns (500 µm), between about five nanometers (5 nm) and about one hundred microns (100 µm), or even between about five nanometers (5 nm) and about ten microns (10 µm). If the MEMS device to be fabricated comprises a resonator, the resonant frequencies of the resonator to be formed may be affected by the thickness of the layer of material 146, and the thickness of the layer of material 146 and the ultimate resonator formed from a portion of the layer of material 146 may be selected accordingly.

As shown in FIG. 12, the SOI-type structure 144 is bonded to the second major surface 106 of the substrate 100 such that the layer of material 146 is disposed between the substrate 100 and the bulk material 148. Stated another way, the layer of material 146 may be bonded to the second major surface 106 of the substrate 100. In some embodiments, the layer of material 146 may be bonded to the second major surface 106 of the substrate 100 using a direct bonding process without using any adhesive therebetween.

The layer of material 146 may be bonded to the second major surface 106 of the substrate 100 using a direct bonding process in which the layer of material 146 is directly bonded to the second major surface 106 by providing direct atomic bonds therebetween. In other words, the layer of material 146 may be directly bonded to the substrate 100 without using an adhesive or any other intermediate bonding material between the layer of material 146 and the substrate 100. The nature of the atomic bonds between the layer of material 146 and the substrate 100 will depend upon the material compositions at the surfaces of each of the layer of material 146 and the substrate 100. In some embodiments, silicon dioxide ($SiO_2$) may be provided on the exposed major surface of the layer of material 146 and on the second major surface 106 of the substrate 100. Thus, in accordance with such embodiments, direct atomic bonds may be provided between silicon dioxide on the exposed major surface of the layer of material 146 and on the second major surface 106 of the substrate 100. Stated another way, the bonding surface of the layer of material 146 may comprise an oxide material (e.g., silicon dioxide ($SiO_2$)) and the bonding surface of the substrate 100 may be at least substantially comprised of the same oxide material (e.g., silicon dioxide ($SiO_2$)). In such embodiments, a silicon oxide-to-silicon oxide surface direct-bonding process may be used to bond the bonding surface of the layer of material 146 to the bonding surface of the substrate 100. In such embodiments, as shown in FIG. 12, a bonding material 152 (e.g., a layer of oxide such as silicon dioxide) may be disposed between the layer of material 146 and the substrate 100 at a bonding interface therebetween. The bonding material 152 may have an average thickness of, for example, between about one nanometer (1 nm) and about one micron (1 µm).

In additional embodiments, the bonding surface of the layer of material 146 may comprise a semiconductor material (e.g., silicon), and the bonding surface of the substrate 100 may be at least substantially comprised of the same semiconductor material (e.g., silicon). In such embodiments, a silicon-to-silicon surface direct-bonding process may be used to bond the bonding surface of the layer of material 146 to a bonding surface of the substrate 100.

In some embodiments, the direct bond between the bonding surface of the layer of material 146 and the bonding surface of the substrate 100 may be established by forming each of the bonding surface of the layer of material 146 and the bonding surface of the substrate 100 to have relatively smooth surfaces, and subsequently abutting the bonding surfaces together and initiating propagation of a bonding wave therebetween.

For example, each of the bonding surface of the layer of material 146 and the bonding surface of the substrate 100 may be formed to have a root mean square surface roughness ($R_{RMS}$) of about two nanometers (2.0 nm) or less, about one nanometer (1.0 nm) or less, or even about one-quarter of a nanometer (0.25 nm) or less. Each of the bonding surface of the layer of material 146 and the bonding surface of the substrate 100 may be smoothened using at least one of a mechanical polishing process and a chemical etching process. For example, a chemical-mechanical polishing (CMP) process may be used to planarize and/or reduce the surface roughness of each of the bonding surface of the layer of material 146 and the bonding surface of the substrate 100.

After smoothening the bonding surfaces, the bonding surfaces optionally may be cleaned and/or activated using processes known in the art. Such an activation process may be used to alter the surface chemistry at the bonding surfaces in a manner that facilitates the bonding process and/or results in the formation of a stronger bond.

The bonding surfaces may be brought into direct physical contact with one another, and pressure may be applied in a localized area across the bonding interface. Inter-atomic bonds may be initiated in the vicinity of the localized pressure area, and a bonding wave may propagate at a rapid rate across the interface between the bonding surfaces.

Optionally, an annealing process may be used to strengthen the bond. Such an annealing process may comprise heating the layer of material 146 and the substrate 100 in a furnace at a temperature of between about one hundred degrees Celsius (100° C.) and about four hundred degrees Celsius (400° C.) for a time of between about two minutes (2 mins.) and about fifteen hours (15 hrs.).

In some embodiments, the transducer cavity recesses 142 may be hermetically sealed between layer of material 146 of the SOI-type structure 144 and the substrate 100 during the direct bonding process. In some embodiments, layer of material 146 of the SOI-type structure 144 may be bonded to the substrate 100 under vacuum, such that a vacuum is permanently sealed within the transducer cavity recesses 142. In other embodiments, the layer of material 146 of the SOI-type structure 144 may be bonded to the substrate 100 in an inert gas environment, such that inert gas is permanently sealed within the transducer cavity recesses 142. In yet further embodiments, the layer of material 146 of the SOI-type structure 144 may be bonded to the substrate 100 under ambient conditions, such that air is permanently sealed within the transducer cavity recesses 142.

Figure 13:
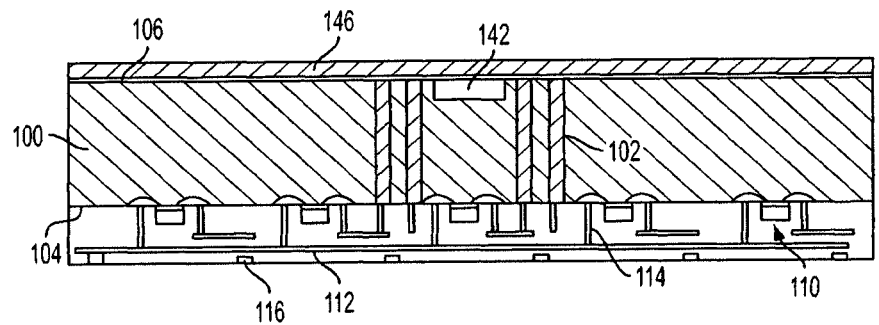

Referring to FIG. 13, after bonding the SOI-type structure 144 (FIG. 12) to the second major surface 106 of the substrate 100, the bulk material 148 of the SOI-type structure 144 may be removed leaving the layer of material 146 (and optionally the intermediate material 150) behind and bonded to the substrate 100. In some embodiments, the bulk material 148 of the SOI-type structure 144 may be removed by fracturing the SOI-type structure 144 (FIG. 12) along the intermediate material 150. In other embodiments, one or more of an etching process, a grinding process, and a polishing process (e.g., a chemical-mechanical polishing (CMP) process) may be used to remove the bulk material 148 (and optionally the intermediate material 150).

In additional embodiments, the structure of FIG. 13, which includes the layer of material 146 (and optionally the intermediate material 150), may be formed using what is referred to in the art as a SMART CUT® process. Such processes are described in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (issued Sep. 20, 2005), the disclosures of which are incorporated herein in their entireties by this reference. Briefly, in such methods, ions may be implanted into a wafer of bulk material (which may not comprise an SOI-type structure 144) along an ion implant plane to define a plane of weakness within the wafer. The wafer then may be attached to the second major surface 106 of the substrate 100 as previously described herein in relation to the bonding of the SOI-type structure 144 to the substrate 100 with reference to FIG. 12. The wafer then may be cleaved or otherwise fractured along the ion implant plane to separate the layer of material 146 from the wafer, leaving the layer of material 146 bonded to the second major surface 106 of the substrate 100. The bonding and fracturing process may be performed at a temperature of about 400° C. or less. The fractured surface of the layer of material 146 may be smoothed using a chemical-mechanical polishing (CMP) process after the fracturing process.

In yet further embodiments, the structure of FIG. 13, which includes the layer of material 146 (and optionally the intermediate material 150), may be formed by bonding a wafer of bulk material (which may not comprise an SOI-type structure 144) to the second major surface 106 of the substrate 100 using, for example, a direct bonding process as previously described herein in relation to the bonding of the SOI-type structure 144 to the substrate 100 with reference to FIG. 12. The wafer then may be thinned from a side thereof opposite the substrate 100 to form the layer of material 146. The thinning process may comprise at least one of a grinding process, an etching process, and a polishing process (e.g., a chemical-mechanical polishing (CMP) process).

Figure 14:
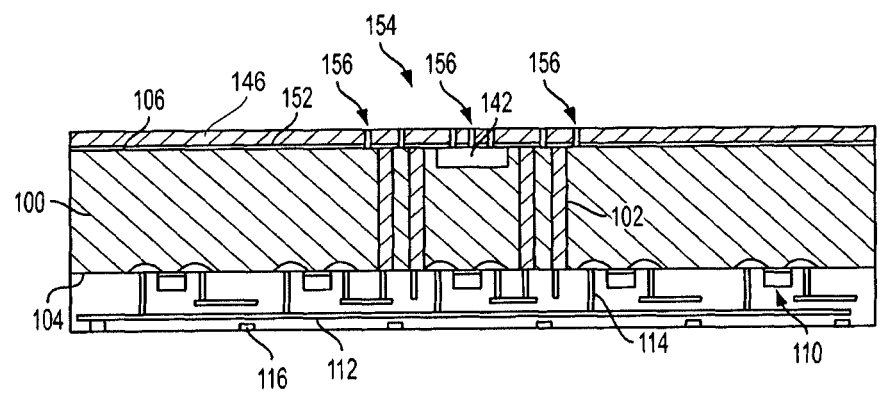

As shown in FIG. 14, a region of the layer of material 146 proximate the transducer cavity recess 142 may be processed to form a transducer 154 over and adjacent the transducer cavity recess 142. By way of example and not limitation, trenches and/or holes 156 may be formed in or through the layer of material 146 proximate the transducer cavity recess 142 to selectively reduce the structural support for a portion of the layer of material 146 to comprise the transducer 154, and/or to electrically isolate regions of the layer of material 146 comprising the transducer 154. The particular structure of the transducer 154 is not critical to embodiments of the disclosure, and various configurations of transducers may be employed. Additional processing may be employed as needed to form a transducer 154 having a desirable configuration and comprising a portion of the layer of material 146. As non-limiting examples, the transducer 154 may comprise a resonator, such as a plate acoustic wave resonator, a flexural mode resonator, a bulk acoustic wave (BAW) resonator, a surface acoustic wave (SAW) resonator, or a film bulk acoustic resonator (FBAR). In other embodiments, the transducer 154 may comprise a sensor configured to electrically sense mechanical deformation of, or vibrations in, a portion of the transducer 154.

Figure 15:
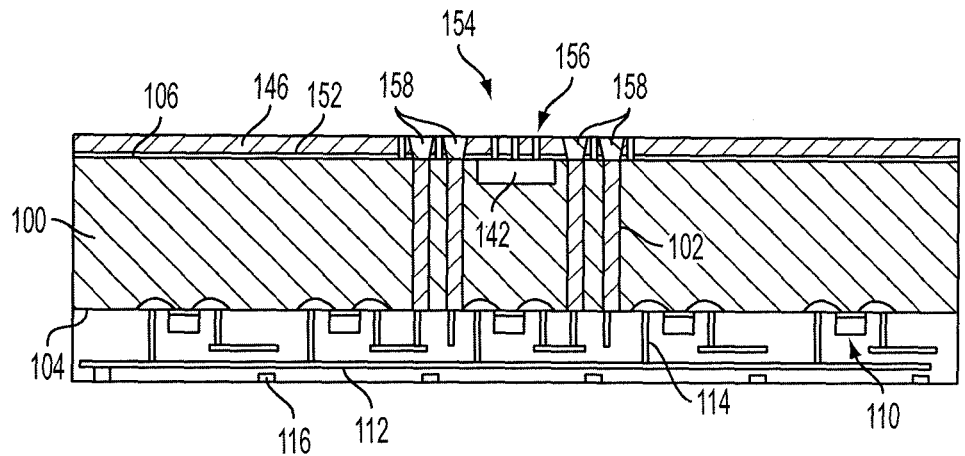

Referring to FIG. 15, in embodiments in which a bonding material 152 is present between the layer of material 146 and the second major surface 106 of the substrate 100 and the bonding material 152 is not electrically conductive, electrical interconnection may be established between the transducer 154 and one or more of the conductive vias 102 by, for example, forming electrically conductive plugs 158 that extend through the layer of material 146 and the bonding material 152 to the ends of the conductive vias 102 at the second major surface 106 of the substrate 100. For example, holes may be formed through the layer of material 146 and the bonding material 152 using a masking and etching process as previously described therein, after which conductive material may be deposited within the holes to form the conductive plugs 158. For example, a conductive metal or metal alloy may be deposited in the holes using one or more of a deposition process (e.g., a physical vapor deposition (PVD) process, a chemical vapor deposition (CVD) process, etc.), an electroless plating process, and an electrolytic plating process. The conductive plugs 158 may be in physical and electrical contact with the conductive vias 102 and with portions of the layer of material 146 that comprise elements or features of the transducer 154, thus providing electrical interconnection therebetween.

Figure 16:
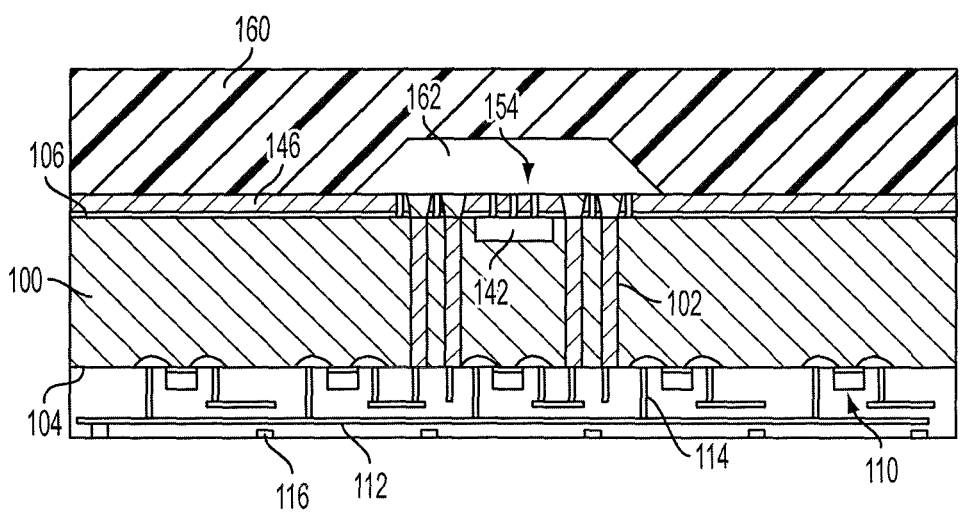

Referring to FIG. 16, a cap structure 160 may be provided over the layer of material 146 and the transducer 154. The cap structure 160 may comprise another transducer cavity recess 162 located and configured to be disposed adjacent the transducer 154 on a side thereof opposite the transducer cavity recess 142 formed in the substrate 100.

The cap structure 160 may comprise, for example, a ceramic such as an oxide (e.g., aluminum oxide, zirconium oxide, silicon oxide, etc.), a nitride (e.g., silicon nitride), or a carbide (e.g., silicon carbide). In other embodiments, the cap structure 160 may comprise a semiconductor material (e.g., silicon, germanium, a III-V semiconductor material, etc.) or a metal or metal alloy. Additionally, the material of the cap structure 160 may be amorphous material or crystalline (polycrystalline or monocrystalline). The transducer cavity recess 162 may be formed in the cap structure 160 as previously described in relation to the recess 120 of FIG. 5.

The cap structure 160 may be bonded to the layer of material 146 using, for example, a direct bonding process as previously described with reference to FIG. 12. In other embodiments, the cap structure 160 may be bonded to the layer of material 146 using an adhesive.

The transducer 154 may be hermetically sealed between the cap structure 160 and the substrate 100. In some embodiments, the cap structure 160 may be bonded to the layer of material 146 under vacuum, such that a vacuum is permanently sealed within the transducer cavity recesses 142, 1.62. In other embodiments, the cap structure 160 may be bonded to the layer of material 146 in an inert gas environment, such that inert gas is permanently sealed within the transducer cavity recesses 142, 162. In yet further embodiments, the cap structure 160 may be bonded to the layer of material 146 under ambient conditions, such that air is permanently sealed within the transducer cavity recesses 142, 162.

Figure 17:
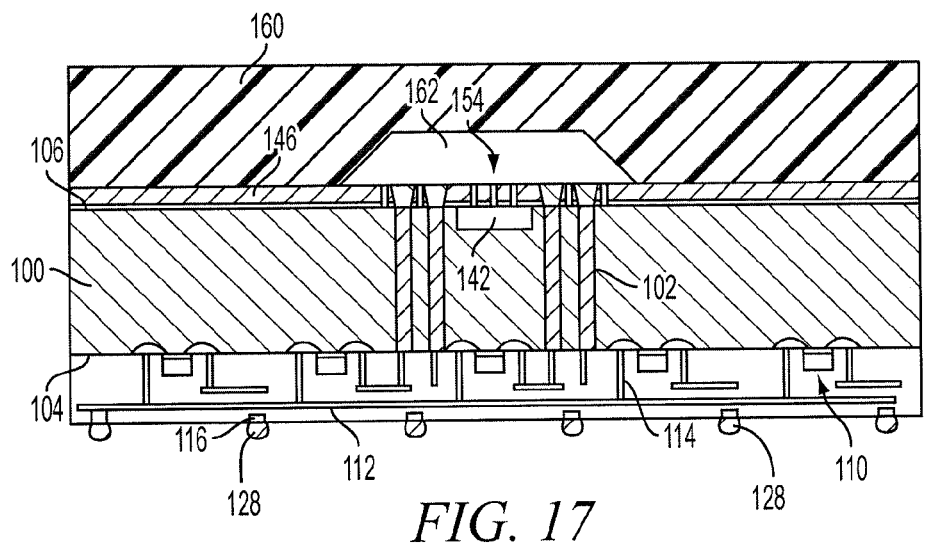
Figure 18:
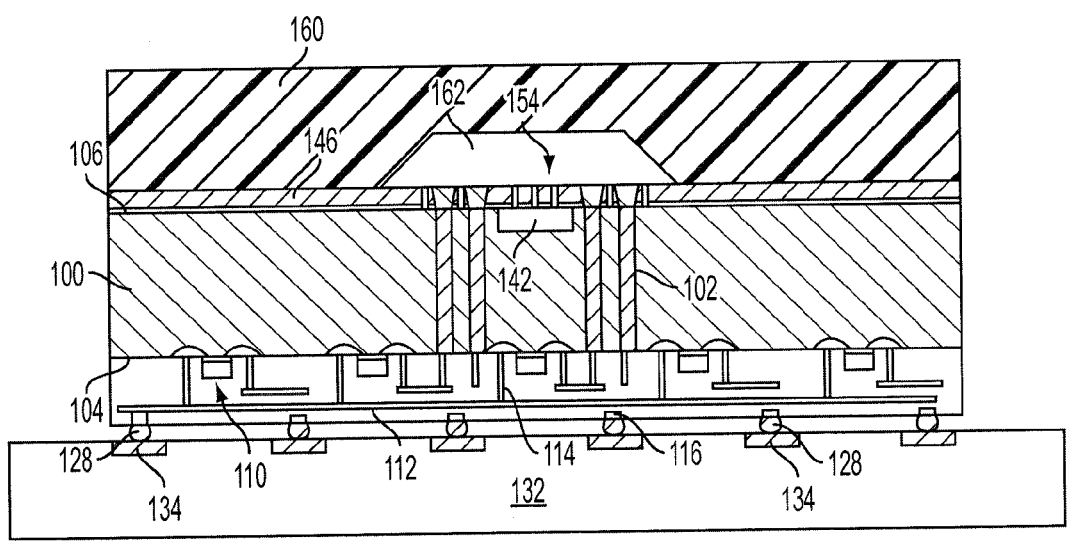

As shown in FIG. 17, bumps or balls 128 of electrically conductive metal or metal alloy optionally may be formed on the contact pads 116 over the first major surface 104 of the substrate 100, as previously described with reference to FIG. 7. The structure of FIG. 17 may be structurally and electrically coupled to another structure or device 132 as shown in FIG. 18. The structure or device 132 may comprise, for example, a higher level substrate, such as a printed circuit board.

FIGS. 19 through 28 are used to illustrate additional embodiments of methods of the present disclosure, wherein a portion of a MEMS device is integrally formed on the second major surface 106 of the substrate 100 and another portion of the MEMS device is fabricated separately and bonded to the integral portion of the MEMS device.

Figure 19:
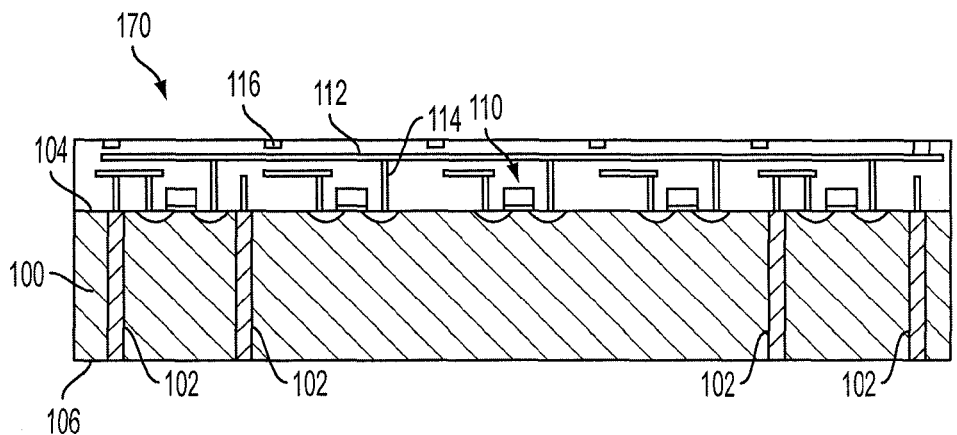
FIGS. 19 through 28 illustrate another example of a method that may be used to form a semiconductor device comprising at least a portion of an integrated circuit and a MEMS device operatively coupled with the integrated circuit, wherein a portion of the MEMS device is integrally fabricated with the substrate on which the integrated circuit is formed and another portion of the MEMS device is fabricated separately from the substrate and subsequently bonded to the substrate.

FIG. 19 illustrates a structure 170 that is generally similar to that shown in FIG. 10. The structure 170 includes a substrate 100 having a first major surface 104 and an opposing second major surface 106. Conductive vias 102 extend at least partially through the substrate 100 from the first major surface 104 toward the second major surface 106. The structure 140 also includes transistors 110, and electrically conductive features formed over the transistors 110, such as conductive lines 112, conductive vias 114, and electrical contact pads 116. The structure 170 differs from that of FIG. 10 only in the position of the conductive vias 102 within the substrate 100. The structure 170 may be formed using the methods previously described with reference to FIGS. 1 through 4, 9, and 10.

Figure 20:
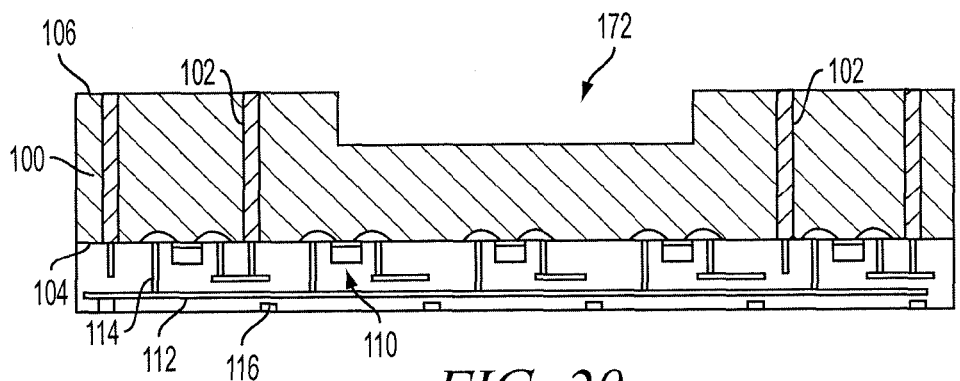

Referring to FIG. 20, at least one transducer cavity recess 172 may be formed in the second major surface 106 of the substrate 100. The transducer cavity recess 172 is ultimately used to form at least a portion of a transducer cavity in which at least a portion of a transducer of a MEMS device is to be disposed. The transducer cavity recess 172 may be formed in the second major surface 106 of the substrate 100 using, for example, a photolithographic masking and etching process like that previously described in relation to the recess 120 of FIG. 5. The transducer cavity recess 172 may have any desirable size and shape, and the desired size and shape may be at least partially a function of the type of transducer to be formed. In embodiments in which the transducer to be formed comprises a resonator, the frequencies at which the resonator is to resonate may be at least partially a function of the size and shape of the transducer cavity recess 172, and the size and shape of the transducer cavity recess 172 may be designed and selected to provide desirable resonant frequencies.

In some embodiments, the transducer cavity recess 172 may be located proximate one or more of the conductive vias 102. Optionally, the transducer cavity recess 172 may be located between at least two conductive vias 102, as shown in FIG. 20, such that a first conductive via is disposed on a first lateral side of the transducer cavity recess 172 and a second conductive via is disposed on an opposing lateral side of the transducer cavity recess 172.

After integrally forming the transducer cavity recess 172 in the substrate 100, a transducer may be formed over the transducer cavity recess 172. To form the transducer over the transducer cavity recess 172, a portion of a MEMS device comprising a transducer may be fabricated separately from the substrate 100, and subsequently bonded over the second major surface 106 of the substrate 100 and over the transducer cavity recess 172, as described below.

Figure 21:
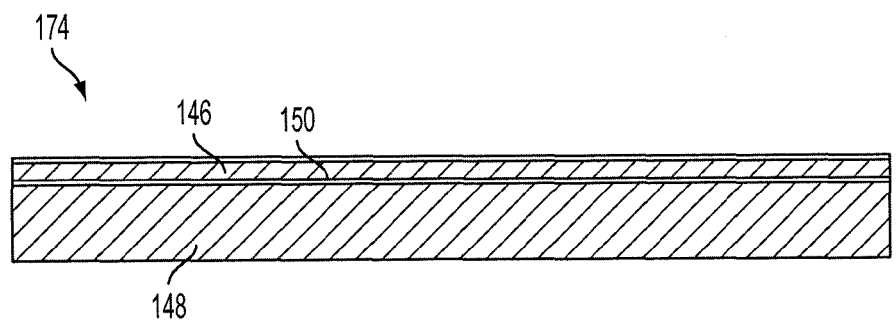

FIG. 21 illustrates a semiconductor-on-insulator-type (SOI-type) structure 174, which may be as previously described in relation to the SOI-type structure 144 of FIG. 12. Thus, the SOI-type structure 174 includes a relatively thin layer of material 146 bonded to a relatively thick volume of bulk material 148 with an intermediate material 150 between the layer of material 146 and the bulk material 148. The layer of material 146 is thin relative to the bulk material 148, and the bulk material 148 is thick relative to the layer of material 146. The intermediate material 150 may be approximately equal in thickness to the layer of material 146, or it may be thinner than the layer of material 146. A portion of the layer of material 146 is ultimately used to form at least a portion of a transducer (e.g., a resonator or a sensor). The layer of material 146, the bulk material 148, and the intermediate material 150 may have compositions and configurations as previously described with reference to FIG. 12.

Figure 22:
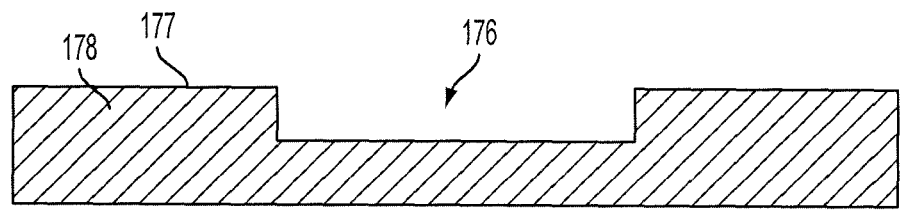

FIG. 22 illustrates another transducer cavity recess 176 formed in a major surface 177 of another substrate 178, which is initially separate from the SOI-type structure 174 of FIG. 21 and subsequently bonded thereto as discussed below with reference to FIG. 23. With continued reference to FIG. 22, the substrate 178 may comprise any of a number of substrate materials. As non-limiting examples, the substrate 178 may comprise a ceramic such as an oxide (e.g., aluminum oxide, zirconium oxide, silicon oxide, etc.), a nitride (e.g., silicon nitride), or a carbide (e.g., silicon carbide). In other embodiments, the substrate 178 may comprise a semiconductor material (e.g., silicon, germanium, a III-V semiconductor material, etc.) or a metal or metal alloy. The substrate 178 may comprise an amorphous material or a crystalline material (e.g., polycrystalline or monocrystalline material). In some embodiments, the substrate 178 may comprise a multi-layer substrate including two or more of the materials mentioned above. The transducer cavity recess 176, together with the transducer cavity recess 172 of FIG. 20, is ultimately used to form a transducer cavity in which at least a portion of a transducer of a MEMS device is to be disposed. The transducer cavity recess 176 may be formed in the surface 177 of the substrate 178 using, for example, a photolithographic masking and etching process like that previously described in relation to the recess 120 of FIG. 5. The transducer cavity recess 176 may have any desirable size and shape, and the desired size and shape may be at least partially a function of the type of transducer to be formed. In embodiments in which the transducer to be formed comprises a resonator, the frequencies at which the resonator is to resonate may be at least partially a function of the size and shape of the transducer cavity recess 176, and the size and shape of the transducer cavity recess 176 may be designed and selected to provide desirable resonant frequencies.

Figure 23:
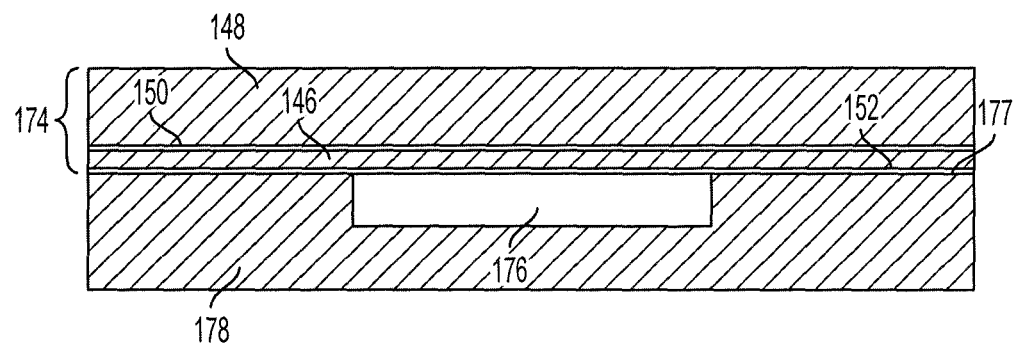

Referring to FIG. 23, the SOI-type structure 174 of FIG. 21 is bonded to the surface 177 of the substrate 178 of FIG. 22 such that the layer of material 146 of the SOI-type structure 174 is disposed between the substrate 178 and the bulk material 148. In some embodiments, the layer of material 146 may be bonded to the major surface 177 of the substrate 178 using a direct bonding process as previously described with reference to FIG. 12. As described with reference to FIG. 12, a bonding material 152 may be disposed between the layer of material 146 and the substrate 178 in some embodiments.

Figure 24:
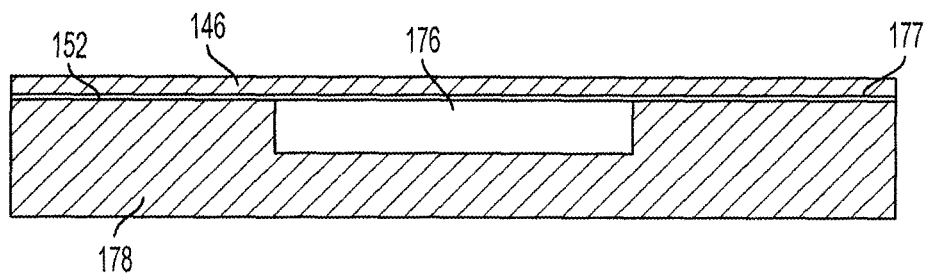

Referring to FIG. 24, after bonding the SOI-type structure 144 (FIG. 12) to the major surface 177 of the substrate 178, the bulk material 148 of the SOI-type structure 174 may be removed leaving the layer of material 146 (and optionally the intermediate material 150) behind and bonded to the substrate 178. In some embodiments, the bulk material 148 of the SOI-type structure 174 may be removed by fracturing the SOI-type structure 174 (FIG. 23) along the intermediate material 150. In other embodiments, one or more of an etching process, a grinding process, and a polishing process (e.g., a chemical-mechanical polishing (CMP) process) may be used to remove the bulk material 148 (and optionally the intermediate material 150).

Figure 25:
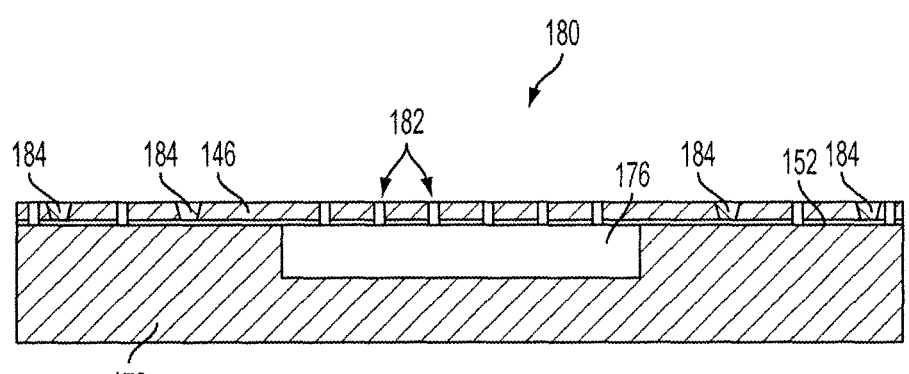

As shown in FIG. 25, a region of the layer of material 146 proximate the transducer cavity recess 176 may be processed to form a transducer 180 over and adjacent the transducer cavity recess 176. By way of example and not limitation, trenches and/or holes 182 may be formed in or through the layer of material 146 proximate the transducer cavity recess 176 to selectively reduce the structural support for a portion of the layer of material 146 to comprise the transducer 180, and/or to electrically isolate regions of the layer of material 146 comprising the transducer 180. The particular structure of the transducer 180 is not critical to embodiments of the disclosure, and various configurations of transducers may be employed. Additional processing may be employed as needed to form a transducer 180 having a desirable configuration and comprising a portion of the layer of material 146. As non-limiting examples, the transducer 180 may comprise a resonator, such as a plate acoustic wave resonator, a flexural mode resonator, a bulk acoustic wave (BAW) resonator, a surface acoustic wave (SAW) resonator, or a film bulk acoustic resonator (FBAR). In other embodiments, the transducer 180 may comprise a sensor configured to electrically sense mechanical deformation of, or vibrations in, a portion of the transducer 180.

Electrically conductive plugs or contacts 184 optionally may be formed on or in selected regions of the layer of material 146, and the conductive plugs or contacts 184 may be located and configured to make electrical contact with selected regions of the resonator 180 and to ends of the conductive vias 102 in the structure of FIG. 20, as discussed below. For example, holes may be formed through the layer of material 146 and the bonding material 152 using a masking and etching process as previously described therein, after which conductive material may be deposited within the holes to form the conductive plugs 158.

Figure 26:
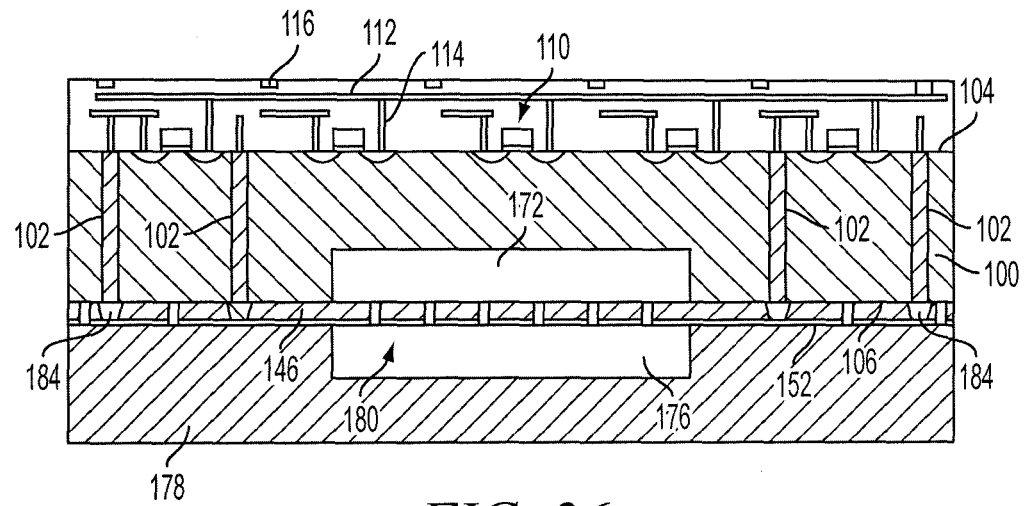

Referring to FIG. 26, the structure of FIG. 25 may be bonded to the structure of FIG. 20 to form the bonded structure shown in FIG. 26. In particular, the layer of material 146 of the structure of FIG. 25 may be bonded to the second major surface 106 of the substrate 100 in the structure of FIG. 20. The transducer 180 and the transducer cavity recess 176 in the substrate 178 may be aligned with the transducer cavity recess 172 in the substrate 100. In this configuration, the transducer 180 is disposed in a transducer cavity defined by the transducer cavity recesses 172, 176. Further, at least a portion of the transducer 180 comprising a region of the layer of material 146 extends unsupported between the recesses 172, 176, such that the portion of the layer of material 146 may physically move (e.g., deflect or vibrate) within the transducer cavity.

The layer of material 146 may be bonded to the second major surface 106 of the substrate 100 using, for example, a direct bonding process as previously described with reference to FIG. 12. In other embodiments, the layer of material 146 may be bonded to the second major surface 106 of the substrate 100 using an adhesive.

The transducer 180 may be hermetically sealed between the substrate 178 and the substrate 100. In some embodiments, the structure of FIG. 25 may be bonded to the structure of FIG. 20 under vacuum, such that a vacuum is permanently sealed within the transducer cavity recesses 172, 176. In other embodiments, the structure of FIG. 25 may be bonded to the structure of FIG. 20 in an inert gas environment, such that inert gas is permanently sealed within the transducer cavity recesses 172, 176. In yet further embodiments, the structure of FIG. 25 may be bonded to the structure of FIG. 20 under ambient conditions, such that air is permanently sealed within the transducer cavity recesses 172, 176.

Figure 27:
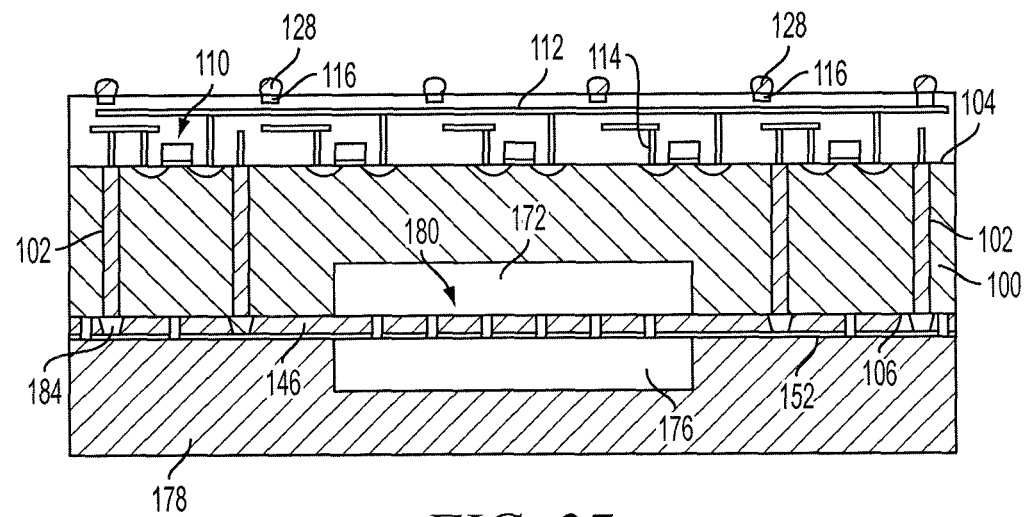
Figure 28:
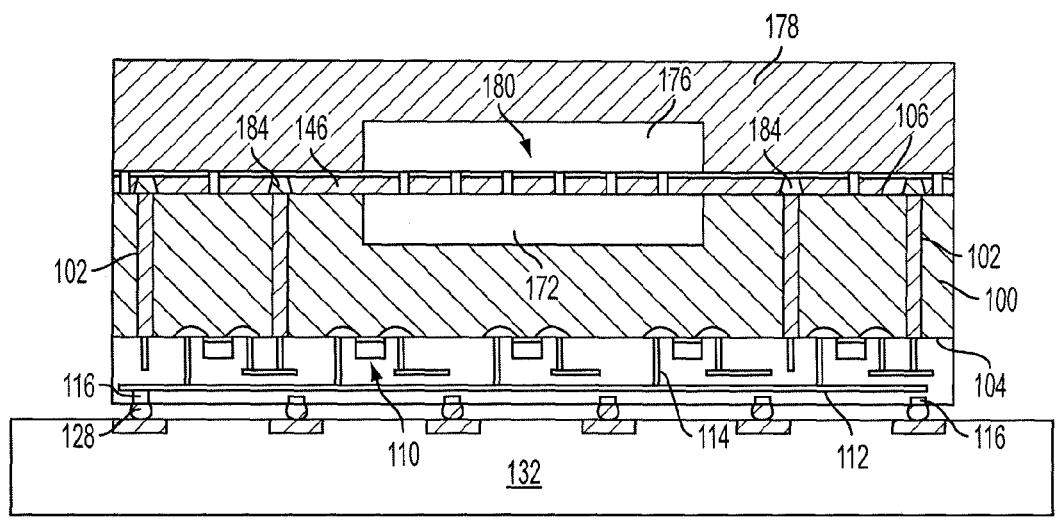

Although the transducer cavity recess 172 and the transducer cavity recess 176 are illustrated in FIGS. 26 through 28 as having at least substantially the same size, in additional embodiments, the transducer cavity recess 172 may be larger or smaller than the transducer cavity recess 176.

As shown in FIG. 27, bumps or balls 128 of electrically conductive metal or metal alloy optionally may be formed on the contact pads 116 over the first major surface 104 of the substrate 100, as previously described with reference to FIG. 7. The structure of FIG. 27 may be structurally and electrically coupled to another structure or device 132 as shown in FIG. 28. The structure or device 132 may comprise, for example, a higher level substrate, such as a printed circuit board.

Additional non-limiting example embodiments of the present disclosure are set forth below.

Embodiment 1

A method of forming a semiconductor device comprising an integrated circuit and a MEMS device operatively coupled with the integrated circuit, comprising: forming an electrically conductive via extending at least partially through a substrate from a first major surface of the substrate toward an opposing second major surface of the substrate; fabricating at least a portion of an integrated circuit on the first major surface of the substrate; and providing a MEMS device on the second major surface of the substrate and operatively coupling the MEMS device with the integrated circuit using the at least one electrically conductive via.

Embodiment 2

The method of Embodiment 1, further comprising selecting the MEMS device to comprise at least one of a resonator and a sensor.

Embodiment 3

The method of Embodiment 2, further comprising selecting the MEMS device to comprise at least one of a plate acoustic wave resonator, a flexural mode resonator, a bulk acoustic wave (BAW) resonator, a surface acoustic wave (SAW) resonator, and a film bulk acoustic resonator (FBAR).

Embodiment 4

The method of any one of Embodiments 1 through 3, wherein fabricating the at least a portion of the integrated circuit on the first major surface of the substrate comprises forming at least one transistor on the first major surface of the substrate.

Embodiment 5

The method of any one of Embodiments 1 through 4, wherein fabricating the at least a portion of the integrated circuit on the first major surface of the substrate further comprises forming at least one electrically conductive feature over the first major surface of the substrate, the at least one electrically conductive feature electrically coupled with the electrically conductive via.

Embodiment 6

The method of any one of Embodiments 1 through 5, wherein providing the MEMS device on the second major surface of the substrate comprises bonding a separately fabricated MEMS device on the second major surface of the substrate.

Embodiment 7

The method of Embodiment 6, wherein bonding the separately fabricated MEMS device on the second major surface of the substrate comprises structurally and electrically coupling an end of the electrically conductive via to an electrically conductive feature of the MEMS device.

Embodiment 8

The method of Embodiment 6 or Embodiment 7, wherein bonding the separately fabricated MEMS device on the second major surface of the substrate comprises: forming a recess in the second major surface of the substrate; and positioning the separately fabricated MEMS device at least partially within the recess.

Embodiment 9

The method of any one of Embodiments 1 through 5, wherein providing the MEMS device on the second major surface of the substrate comprises integrally forming at least a portion of the MEMS device on the second major surface of the substrate.

Embodiment 10

The method of Embodiment 9, wherein integrally forming the at least a portion of the MEMS device on the second major surface of the substrate comprises: forming at least one transducer cavity recess in the second major surface of the substrate; and providing a transducer on the second major surface of the substrate over the transducer cavity recess.

Embodiment 11

The method of Embodiment 10, wherein providing the transducer on the second major surface of the substrate over the transducer cavity recess comprises: bonding an SOI-type structure to the second major surface of the substrate, the SOI-type substrate including a relatively thin layer of material bonded to a relatively thick volume of bulk material with an intermediate material between the relatively thin layer of material and the relatively thick volume of bulk material; removing a portion of the SOI-type structure and leaving the thin layer of material bonded to the second major surface of the substrate; and configuring a portion of the thin layer of material over the transducer cavity recess to comprise at least a portion of the transducer.

Embodiment 12

The method of Embodiment 10, wherein providing the transducer on the second major surface of the substrate over the transducer cavity recess comprises: forming separately from the substrate a structure comprising a layer of material suspended over another transducer cavity recess in another substrate; and bonding the another substrate to the second major surface of the substrate such that a transducer portion of the layer of material extends between the transducer cavity recess in the second major surface of the substrate and the another transducer cavity recess in the another substrate.

Embodiment 13

A semiconductor structure, comprising: at least a portion of an integrated circuit formed on a first major surface of a substrate; a MEMS device comprising a transducer on a second major surface of the substrate, the second major surface disposed on an opposing side of the substrate from the first major surface; and a conductive via extending through the substrate and electrically coupling the MEMS device to the at least a portion of the integrated circuit.

Embodiment 14

The semiconductor structure of Embodiment 13, wherein the transducer comprises at least one of a resonator and a sensor.

Embodiment 15

The semiconductor structure of Embodiment 14, wherein the transducer comprises at least one of a plate acoustic wave resonator, a flexural mode resonator, a bulk acoustic wave (BAW) resonator, a surface acoustic wave (SAW) resonator, and a film bulk acoustic resonator (FBAR).

Embodiment 16

The semiconductor structure of any one of Embodiments 13 through 15, wherein the at least a portion of the integrated circuit on the first major surface of the substrate comprises at least one transistor on the first major surface of the substrate.

Embodiment 17

The semiconductor structure of any one of Embodiments 13 through 16, wherein the at least a portion of the integrated circuit on the first major surface of the substrate comprises at least one electrically conductive feature over the first major surface of the substrate, the at least one electrically conductive feature electrically coupled with the electrically conductive via.

Embodiment 18

The semiconductor structure of any one of Embodiments 13 through 17, wherein the MEMS device comprises a discrete MEMS device formed separately from the substrate and attached to the substrate.

Embodiment 19

The semiconductor structure of Embodiment 18, wherein the discrete MEMS device comprises an electrically conductive feature structurally and electrically coupled to an end of the conductive via.

Embodiment 20

The semiconductor structure of Embodiment 18 or Embodiment 19, wherein the substrate includes a recess extending into the second major surface of the substrate, and wherein the discrete MEMS device is at least partially disposed in the recess.

Embodiment 21

The semiconductor structure of any one of Embodiments 13 through 17, wherein at least a portion of the MEMS device is integrally formed with the substrate on the second major surface of the substrate.

Embodiment 22

The semiconductor structure of Embodiment 21, wherein the at least a portion of the MEMS device integrally formed with the substrate comprises at least one transducer cavity recess in the second major surface of the substrate.

Embodiment 23

The semiconductor structure of Embodiment 21 or Embodiment 22, wherein the MEMS device comprises: another substrate bonded to the second major surface of the substrate; another transducer cavity recess extending into the another substrate; and a layer of material extending between the transducer cavity recess in the second major surface of the substrate and the another transducer cavity recess in the another substrate, at least a portion of the layer of material comprising a transducer.

Embodiment 24

An electronic device, comprising: a substrate having an active surface and an opposing back surface; active components of an integrated circuit on the active surface of the substrate; a MEMS transducer on the back surface of the substrate; and a conductive via extending through the substrate and electrically coupling the MEMS transducer to an active component of the integrated circuit on the active surface of the substrate.

Embodiment 25

The electronic device of Embodiment 24, wherein the MEMS transducer comprises at least one of a plate acoustic wave resonator, a flexural mode resonator, a bulk acoustic wave (BAW) resonator, a surface acoustic wave (SAW) resonator, and a film bulk acoustic resonator (FBAR).

Embodiment 26

The electronic device of Embodiment 24 or Embodiment 25, wherein the MEMS device comprises a discrete MEMS device formed separately from the substrate and attached to the substrate.

Embodiment 27

The electronic device of Embodiment 26, wherein the substrate includes a recess extending into the second major surface of the substrate, and wherein the discrete MEMS device is at least partially disposed in the recess.

Embodiment 28

The electronic device of Embodiment 24 or Embodiment 25, wherein at least a portion of the MEMS device is integrally formed with the substrate on the second major surface of the substrate.

Embodiment 29

The electronic device of Embodiment 28, wherein the MEMS device comprises at least one transducer cavity recess in the second major surface of the substrate.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. Such modifications and embodiments are also intended to fall within the scope of the appended claims.

What is claimed is:

1. A method of forming a semiconductor device comprising an integrated circuit and a MEMS device operatively coupled with the integrated circuit, comprising:

forming an electrically conductive via extending at least partially through a substrate from a first major surface of the substrate toward an opposing second major surface of the substrate;

fabricating at least a portion of an integrated circuit on the first major surface of the substrate; and providing a MEMS device on the second major surface of the substrate and operatively coupling the MEMS device with the integrated circuit using the at least one electrically conductive via, wherein providing the MEMS device on the second major surface of the substrate comprises integrally forming at least a portion of the MEMS device on the second major surface of the substrate, integrally forming the at least a portion of the MEMS device on the second major surface of the substrate comprising:

forming at least one transducer cavity recess in the second major surface of the substrate; and bonding an SOI-type structure to the second major surface of the substrate, the SOI-type substrate including a relatively thin layer of material bonded to a relatively thick volume of bulk material with an intermediate material between the relatively thin layer of material and the relatively thick volume of bulk material;

removing a portion of the SOI-type structure and leaving the thin layer of material bonded to the second major surface of the substrate; and configuring a portion of the thin layer of material over the transducer cavity recess to comprise at least a portion of a transducer of the MEMS device; and further comprising thinning the substrate after fabricating the at least a portion of the integrated circuit on the first major surface of the substrate and before providing the MEMS device on the second major surface of the substrate.

2. The method of claim 1, wherein fabricating the at least a portion of the integrated circuit on the first major surface of the substrate comprises forming at least one transistor on the first major surface of the substrate.

3. The method of claim 2, wherein fabricating the at least a portion of the integrated circuit on the first major surface of the substrate further comprises forming at least one electrically conductive feature over the first major surface of the substrate, the at least one electrically conductive feature electrically coupled with the electrically conductive via.

4. The method of claim 1, further comprising selecting the MEMS device to comprise at least one of a resonator and a sensor.

5. The method of claim 4, further comprising selecting the MEMS device to comprise at least one of a plate acoustic wave resonator, a flexural mode resonator, a bulk acoustic wave (BAW) resonator, a surface acoustic wave (SAW) resonator, and a film bulk acoustic resonator (FBAR).

6. The method of claim 1, wherein fabricating the at least a portion of the integrated circuit on the first major surface of the substrate further comprises forming at least one electrically conductive feature over the first major surface of the substrate, the at least one electrically conductive feature electrically coupled with the electrically conductive via.

7. The method of claim 1, wherein thinning the substrate comprises thinning the substrate to an average thickness of about two hundred fifty microns (250 um) or less.

8. The method of claim 7, wherein thinning the substrate comprises thinning the substrate to an average thickness of about two hundred microns (200 μm) or less.

9. The method of claim 8, wherein thinning the substrate comprises thinning the substrate to an average thickness of about one hundred microns (100 μm) or less.

10. The method of claim 1, wherein the relatively thin layer of material of the SOI-type structure comprises at least one of a piezoelectric material, a semiconductor material, a ceramic material, or a metal material; wherein the piezoelectric materials includes, for example, quartz, $AlPO_4$, $GaPO_4$, $BaTiO_3$, lead zirconate titanate (PZT), zinc oxide, or aluminum nitride.

11. The method of claim 1, wherein the relatively thin layer of material of the SOI-type structure comprises a semiconductor material.

12. The method of claim 11, wherein the semiconductor material comprises at least one of silicon, germanium, or a III-V semiconductor material.

13. The method of claim 1, wherein the relatively thin layer of material of the SOT-type structure has an average layer thickness between about five nanometers (5 nm) and about five hundred microns (500 μm).

14. The method of claim 13, wherein the relatively thin layer of material of the SOI-type structure has an average layer thickness between about five nanometers (5 nm) and about one hundred microns (100 μm).

15. The method of claim 14, wherein the relatively thin layer of material of the SOI-type structure has an average layer thickness between about five nanometers (5 nm) and about ten microns (10 μm).

16. The method of claim 1, wherein bonding an SOI-type structure to the second major surface of the substrate comprises using a direct bonding process to bond the SOI-type structure to the second major surface of the substrate.

17. The method of claim 1, further comprising forming trenches and/or holes in or through the relatively thin layer of material of the SOI-type structure proximate the at least one transducer cavity recess.

18. The method of claim 1, further comprising establishing electrical interconnection between the transducer and the electrically conductive via.

19. The method of claim 1, further comprising providing a cap structure over the relatively thin layer of material of the SOI-type structure, the cap structure comprising another transducer cavity recess located and configured to be disposed adjacent the transducer on a side thereof opposite the at least one transducer cavity recess formed in the substrate.

* * * * *